US009793306B2

United States Patent
Keelan et al.

(10) Patent No.: US 9,793,306 B2
(45) Date of Patent: Oct. 17, 2017

(54) IMAGING SYSTEMS WITH STACKED PHOTODIODES AND CHROMA-LUMA DE-NOISING

(71) Applicant: SEMICONDUCTOR COMPONENTS INDUSTRIES, LLC, Phoenix, AZ (US)

(72) Inventors: Brian Keelan, Boulder Creek, CA (US); Marko Mlinar, Horjul (SI)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 117 days.

(21) Appl. No.: 14/681,250

(22) Filed: Apr. 8, 2015

(65) Prior Publication Data

US 2016/0300870 A1 Oct. 13, 2016

(51) Int. Cl.
*H01L 27/00* (2006.01)
*H01L 27/146* (2006.01)

(52) U.S. Cl.
CPC .... *H01L 27/1461* (2013.01); *H01L 27/14621* (2013.01); *H01L 27/14645* (2013.01); *H01L 27/14647* (2013.01); *H01L 27/14649* (2013.01); *H01L 27/14652* (2013.01)

(58) Field of Classification Search
CPC .. H04N 2209/047; H04N 5/33; H04N 5/3696; H01L 27/14621; H01L 27/14647; H01L 27/14645; H01L 27/14652
See application file for complete search history.

(56) References Cited

U.S. PATENT DOCUMENTS

| 8,258,560 | B1 | 9/2012 | Hynecek | |
|---|---|---|---|---|
| 2009/0160981 | A1 | 6/2009 | Baumgartner et al. | |
| 2011/0317048 | A1 | 12/2011 | Bai et al. | |
| 2012/0075511 | A1* | 3/2012 | Tay | H01L 27/1461 348/280 |
| 2012/0154596 | A1* | 6/2012 | Wajs | H04N 5/33 348/164 |
| 2013/0242148 | A1 | 9/2013 | Mlinar et al. | |

* cited by examiner

*Primary Examiner* — Thanh Luu
(74) *Attorney, Agent, or Firm* — Treyz Law Group, P.C.; Zachary D. Hadd

(57) ABSTRACT

An imaging system may include an image sensor having pixels with stacked photodiodes in which a first photodiode generates a first image signal in response to light of a first wavelength and a second photodiode generates a second image signal in response to light of a second wavelength. The imaging system may include processing circuitry that applies a color correction matrix to isolate components of the first and second signals that are generated in response to light of the first and second wavelengths while removing components of the first and second signals that are generated in response to light of other wavelengths. The processing circuitry may increase noise correlations between the signals to mitigate noise amplification generated by the color correction matrix. The processing circuitry may apply a point filter to increase luma fidelity of the signals.

24 Claims, 12 Drawing Sheets

IMAGING SYSTEMS WITH STACKED PHOTODIODES AND CHROMA-LUMA DE-NOISING

BACKGROUND

This relates to imaging devices, and more particularly, to imaging devices with pixels having stacked photodiodes.

Image sensors are commonly used in electronic devices such as cellular telephones, cameras, and computers to capture images. In a typical arrangement, an electronic device is provided with an array of image pixels arranged in pixel rows and pixel columns. The image pixels generate image signals in multiple color channels. Circuitry is commonly coupled to each pixel column for reading out image signals from the image pixels.

Conventional imaging systems employ a single image sensor in which the visible light spectrum is sampled by red, green, and blue (RGB) image pixels arranged in a Bayer mosaic pattern. The Bayer mosaic pattern consists of a repeating cell of two-by-two image pixels, with two green pixels diagonally opposite one another, and the other corners being red and blue. In such an arrangement each image pixel includes a color filter that allows red, green, or blue light to pass. Each image pixel includes a single photodiode that receives the red, green, or blue light passed through the filter and generates an electrical signal indicative of the amount (i.e., intensity) of the light received through the filter.

In another arrangement, image sensor pixels are configured such that a single image pixel samples red, green, and blue light. Image pixels that sample red, green, and blue light include three photodiodes stacked one on top of another. Differences in the absorption of each of the red, green, and blue wavelengths as light passes through the silicon wafer in which the photodiodes are formed causes each of the three photodiodes to receive primarily one of the colors of light. However, the spectral separation of red, green, and blue light based on absorption depth in the silicon wafer does not sufficiently separate the light to provide isolated red, green, and blue signals that do not include at least some signal representative of light of another color. For example, a blue photodiode may be sensitive to red light that was absorbed prior to reaching the red photodiode, resulting in a blue image signal that is also representative of at least some red light. Performing color correction operations to remove these undesired responses to light of the other two colors causes undesirable amplification of system noise.

Some image pixels include two stacked photodiodes at different depths in the silicon wafer. Each photodiode is configured to absorb a different color of light. The image pixel also has a color filter formed above the stacked photodiodes that absorbs light that neither of the photodiodes is configured to absorb. The two stacked photodiodes may be sensitive to two colors of light having sufficient spectral separation in silicon such that each photodiode absorbs less of the light that the other photodiode is intended to receive (compared to, for example, a pixel having three stacked photodiodes). The color filter may block light having a wavelength that is in between the desired sensitivities of the two photodiodes (i.e., light that neither photodiode is configured to detect). The signals generated by each respective photodiode therefore provide a signal that more accurately represents the respective color of light that the photodiode is intended to receive. While this arrangement offers improved spectral separation, the shallow photodiode still absorbs some of the light that the deeper photodiode is configured to detect, and the deep photodiode may receive some light other than the wavelength it is configured to receive. Color correction operations used to correct for these undesired components in the signals introduces undesirable noise.

It would therefore be desirable to be able to provide imaging devices that generate image signals having reduced noise.

DETAILED DESCRIPTION

Electronic devices such as digital cameras, computers, cellular telephones, and other electronic devices include image sensors that gather incoming light to capture an image. The image sensors may include arrays of image pixels. The pixels in the image sensors may include photosensitive elements such as photodiodes that convert the incoming light into image signals. Image sensors may have any number of pixels (e.g., hundreds or thousands or more). A typical image sensor may, for example, have hundreds of thousands or millions of pixels (e.g., megapixels). Image sensors may include control circuitry such as circuitry for operating the image pixels and readout circuitry for reading out image signals corresponding to the electric charge generated by the photosensitive elements. Readout circuitry may include selectable readout circuitry coupled to each column of pixels that can be enabled or disabled to reduce power consumption in the device and improve pixel readout operations.

Figure 1:
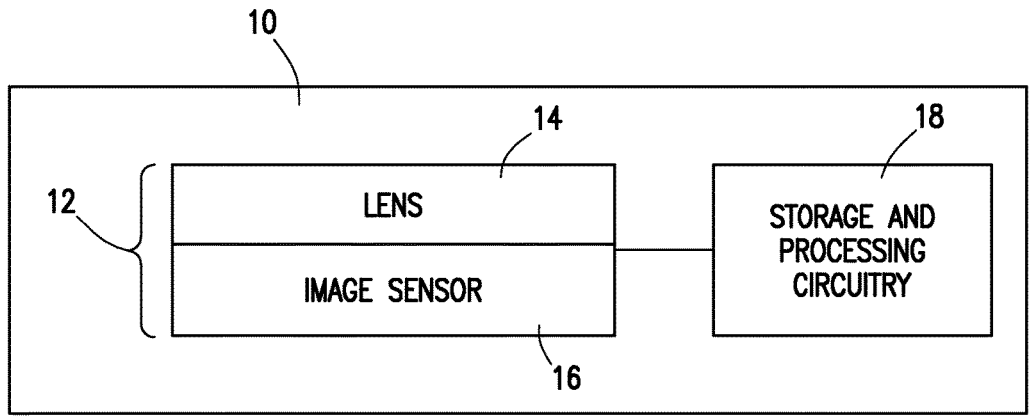
FIG. 1 is a diagram of an illustrative electronic device having an imaging system in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18 (sometimes referred to herein as image processing circuitry 18 or processor 18). If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
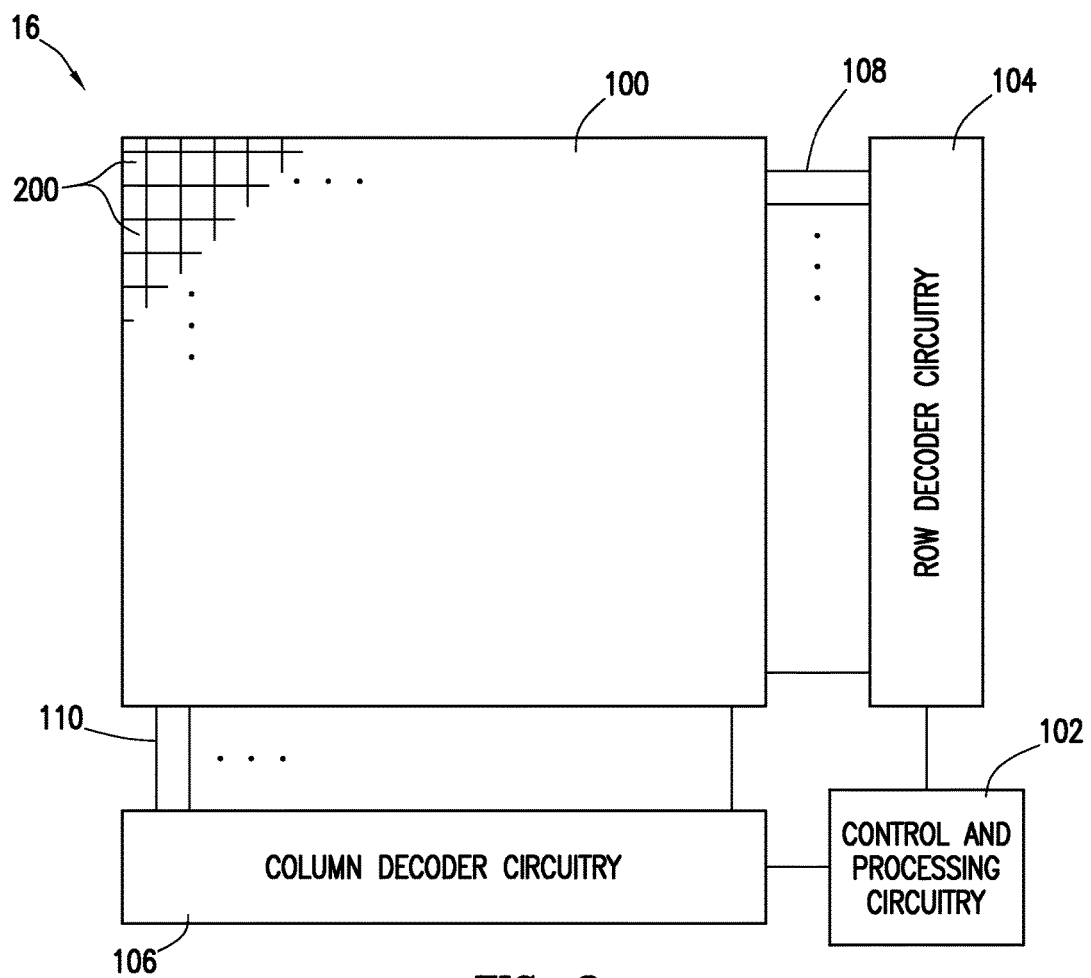
FIG. 2 is a diagram of an illustrative pixel array and associated control circuitry for reading out pixel data from image pixels along column lines in an image sensor in accordance with an embodiment of the present invention.

As shown in FIG. 2, image sensor 16 may include a pixel array 100 containing pixels 200 (sometimes referred to herein as image pixels 200 or image sensor pixels 200) and control and processing circuitry 102. Array 100 may contain, for example, hundreds or thousands of rows and columns of pixels 200. Control circuitry 102 may be coupled to row decoder circuitry 104 and column decoder circuitry 106. Row decoder circuitry 104 may receive row addresses from control circuitry 102 and supply corresponding row control signals such as reset, row-select, transfer, and read control signals to pixels 200 over control paths 108. One or more conductive lines such as column lines 110 may be coupled to each column of pixels 200 in array 100. Column lines 110 may be used for reading out image signals from pixels 200 and for supplying bias signals (e.g., bias currents or bias voltages) to pixels 200. During pixel readout operations, a pixel row in array 100 may be selected using row decoder circuitry 104 and image data associated with image pixels 200 in that pixel row can be read out along column lines 110.

Column decoder circuitry 106 may include sample-and-hold circuitry, amplifier circuitry, analog-to-digital conversion circuitry, bias circuitry, column memory, latch circuitry for selectively enabling or disabling the column circuitry, or other circuitry that is coupled to one or more columns of pixels in array 100 for operating pixels 200 and for reading out image signals from pixels 200. Column decoder circuitry 106 may be used to selectively provide power to column circuitry on a selected subset of column lines 110. Readout circuitry such as signal processing circuitry associated with column decoder circuitry 106 (e.g., sample-and-hold circuitry and analog-to-digital conversion circuitry) may be used to supply digital image data to processor 18 (as shown in FIG. 1, for example) for pixels in chosen pixel columns.

If desired, pixels 200 (such as image pixels 210 or stacked photodiode pixels 220) in array 100 of FIG. 2 may be provided with an array of color filter elements (e.g., an array of color filters 202) that each pass one or more colors of light. All or some of pixels 200 may be provided with a color filter element 202. Color filter elements for pixels 200 may be red color filter elements (e.g., photoresistive material that passes red light while reflecting and/or absorbing other colors of light), blue color filter elements (e.g., photoresistive material that passes blue light while reflecting and/or absorbing other colors of light), and/or green color filter elements (e.g., photoresistive material that passes green light while reflecting and/or absorbing other colors of light). Color filter elements 202 may also be configured to filter light that is outside the visible human spectrum. For example, color filter elements 202 may be configured to filter ultraviolet or infrared light (e.g., color filter element 202 may only allow infrared light or ultraviolet light to reach photodiode 204). Color filter elements may configure image pixel 210 to only detect light of a certain wavelength or range of wavelengths (sometimes referred to herein as a wavelength band) and may be configured to allow multiple wavelengths of light to pass while blocking light of certain other wavelengths (for example, light having a wavelength that corresponds to a certain visible color and/or an infrared or ultraviolet wavelength).

Color filter elements that pass two or more colors of light (e.g., two or more colors of light selected from the group that includes red light, blue light, and green light) are sometimes referred to herein as "broadband" filter elements. For example, yellow color filter elements that are configured to pass red and green light and clear color filter elements that are configured to pass red, green, and blue light may be referred to herein as broadband filter elements or broadband color filter elements. Magenta color filter elements that are configured to pass red and blue light may be also be referred to herein as broadband filter elements or broadband color filter elements. Similarly, image pixels that include a broadband color filter element (e.g., a yellow, magenta, or clear color filter element) and that are therefore sensitive to two or more colors of light (e.g., that capture image signals in response to detecting two or more colors of light selected from the group that includes red light, blue light, and green light) may sometimes be referred to herein as broadband pixels or broadband image pixels. Image signals generated by broadband image pixels may sometimes be referred to herein as broadband image signals. Broadband image pixels may have a natural sensitivity defined by the material that forms the broadband color filter element and/or the material that forms the image sensor pixel (e.g., silicon). In another suitable arrangement, broadband image pixels may be formed without any color filter elements. The sensitivity of broadband image pixels may, if desired, be adjusted for better color reproduction and/or noise characteristics through use of light absorbers such as pigments. In contrast, "colored" pixel may be used herein to refer to image pixels that are primarily sensitive to one color of light (e.g., red light, blue light, green light, or light of any other suitable color). Colored pixels may sometimes be referred to herein as narrowband image pixels because the colored pixels have a narrower spectral response than the broadband image pixels.

If desired, narrowband pixels, broadband pixels, and/or stacked dual photodiode pixels that are not configured to be sensitive to infrared light may be provided with color filters incorporating absorbers of NIR radiation. Color filters that block near-infrared light may minimize the impact of infrared light on color reproduction in illuminants containing both visible and infrared radiation.

Figure 3:
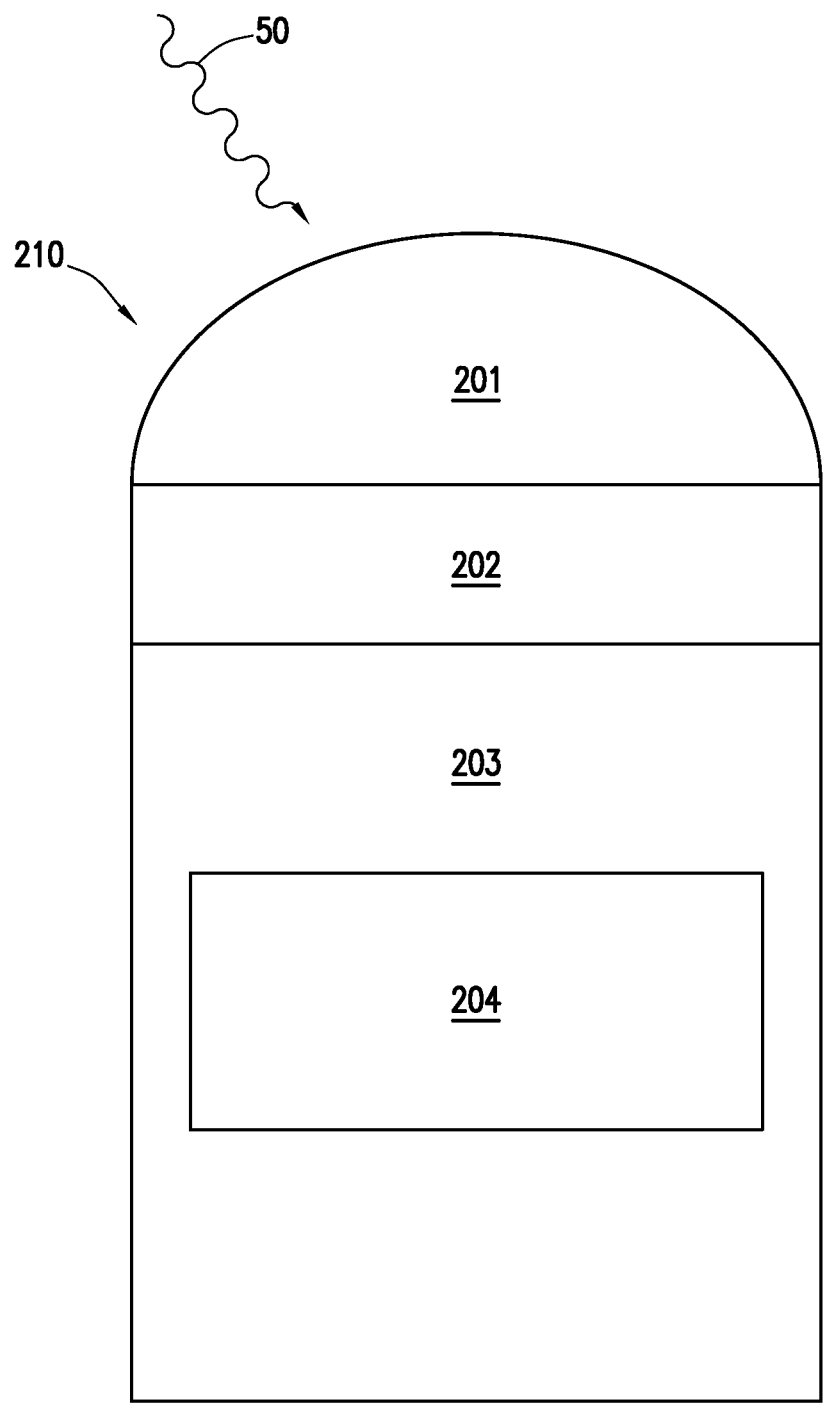
FIG. 3 is a diagram of an illustrative example of a conventional image sensor pixel.

A cross-sectional view of an illustrative image sensor pixel 210 (sometimes referred to herein as image pixel 210 or pixel 210) that may form one or more pixels 200 in pixel array 100 is shown in FIG. 3. Image pixel 210 may be provided with a lens such as lens 201 (sometime referred to herein as microlens 201), a color filter such as color filter 202 (sometimes referred to herein as color filter element 202 or color filter layer 202), and a photosensitive portion such as photodiode 204 formed in a substrate 203 (sometimes referred to herein as a silicon wafer 203 or wafer 203). Microlens 201 may be formed over an upper surface of color filter element 202 to direct incoming light such as image light 50 (sometimes referred to herein as light 50, incoming light 50, incident light 50, or photons 50) through color filter 202 onto photodiode 204 so that only light of a color (i.e., a wavelength or range of wavelengths) corresponding to color filter 202 is captured at photodiode 204.

Figure 4:
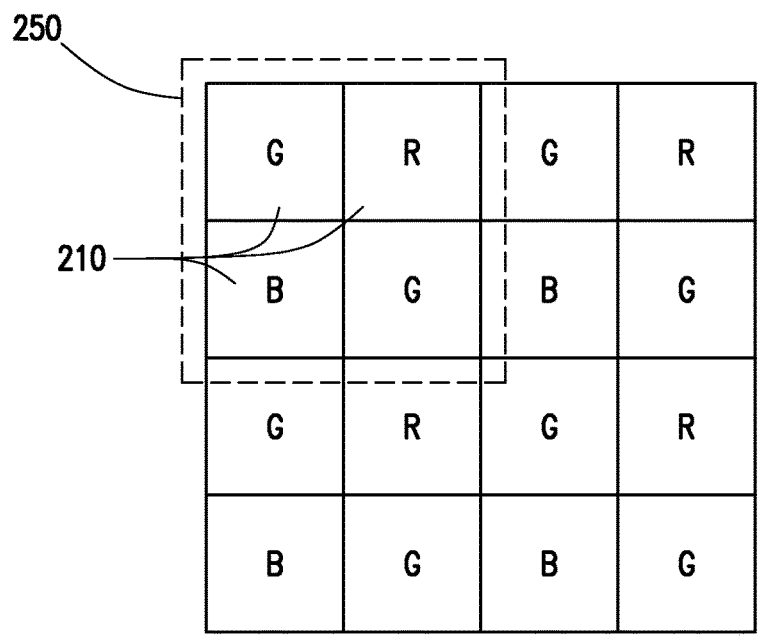
FIG. 4 is a diagram of an illustrative arrangement of image sensor pixels of the type shown in FIG. 3 arranged in a Bayer mosaic pattern.

Pixels 200 in pixel array 100 are conventionally provided with a color filter array (formed of color filters 202, for example) which allows a single image sensor to sample red, green, and blue (RGB) light using corresponding red, green, and blue image sensor pixels arranged in a Bayer mosaic pattern, as shown in FIG. 4. The Bayer mosaic pattern consists of a repeating unit cell 250 (sometimes referred to herein as pixel block 250 or pixel cluster 250) of two-by-two image pixels, with two green image pixels diagonally opposite one another (i.e., two diagonally opposed green pixels) and adjacent to a red image pixel diagonally opposite to a blue image pixel (i.e., diagonally opposed red and blue pixels). However, limitations of signal to noise ratio (SNR) that are associated with the Bayer mosaic pattern make it difficult to reduce the size of image sensors such as image sensor 16.

Figure 5:
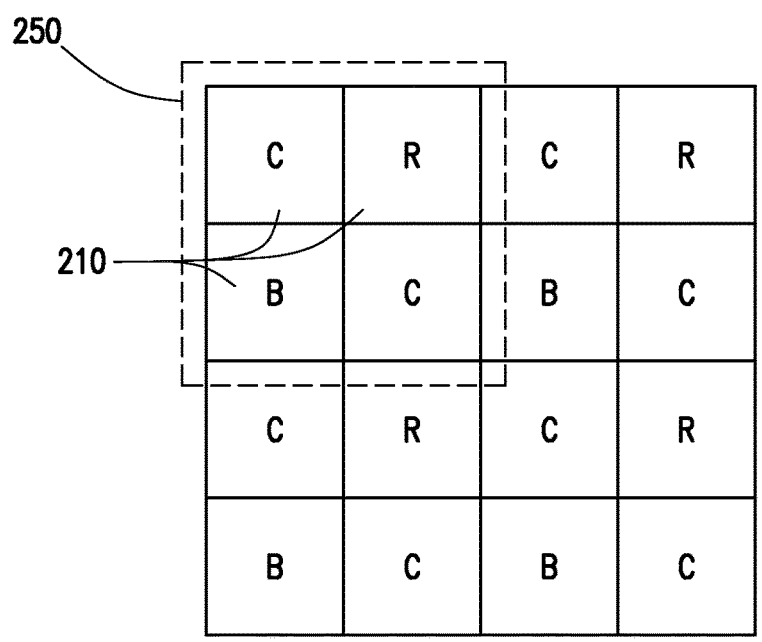
FIG. 5 is a diagram of an illustrative arrangement of image sensor pixels of the type shown in FIG. 3 in which the green pixels of the Bayer pattern shown in FIG. 4 have been replaced with clear pixels.

In one suitable scenario that is sometimes discussed herein as an example, the green pixels in a Bayer pattern are replaced by clear image pixels, as shown in FIG. 5. As shown in FIG. 5, a unit cell 250 of image pixels 210 may be formed from two clear image pixels (sometimes referred to herein as clear (C) image pixels) that are diagonally opposite one another (i.e., two diagonally opposed clear pixels) and adjacent to a red (R) image pixel that is diagonally opposite to a blue (B) image pixel. Clear image pixels 210 in unit cell 250 may be formed with a visibly transparent color filter that transmits light across the visible light spectrum (e.g., clear pixels 210 can capture white light). Clear image pixels 210 may have a natural sensitivity defined by the material that forms the transparent color filter and/or the material that forms the image sensor pixel (e.g., silicon). The sensitivity of clear image pixels 210 may, if desired, be adjusted for better color reproduction and/or noise characteristics through use of light absorbers such as pigments. Unit cell 250 may be repeated across image pixel array 100 to form a mosaic of red, clear, and blue image pixels 210. In this way, red image pixels may generate red image signals in response to red light, blue image pixels may generate blue image signals in response to blue light, and clear image pixels may generate white image signals in response to white light. The white image signals may also be generated by the clear image pixels in response to any suitable combination of red, blue, and/or green light.

The unit cell 250 of FIG. 5 is merely illustrative. If desired, any color image pixels may be formed adjacent to the diagonally opposing clear image pixels in unit cell 250. For example, a unit cell 250 may be defined by two clear image pixels 210 that are formed diagonally opposite one another and adjacent to a red image pixel that is diagonally opposite to a green (G) image pixel (i.e., diagonally opposed red and green pixels). In yet another suitable arrangement, a unit cell 250 may be defined by two clear image pixels 210 that are formed diagonally opposite one another and adjacent to a blue image pixel that is diagonally opposite to a green image pixel (i.e., diagonally opposed blue and green pixels).

Clear image pixels C can help increase the signal-to-noise ratio (SNR) of image signals captured by image pixels 210 by gathering additional light in comparison with image pixels having a narrower color filter (e.g., a filter that transmits light over a subset of the visible light spectrum), such as green image pixels. Clear image pixels C may particularly improve SNR in low light conditions in which the SNR can sometimes limit the image quality of images. Image signals gathered from image pixel array 100 having clear image pixels may be converted to red, green, and blue image signals to be compatible with circuitry and software that is used to drive most image displays (e.g., display screens, monitors, etc.). This conversion generally involves the modification of captured image signals using a color correction matrix (CCM). In the illustrative example of FIG. 5, for example, no isolated green image signal is present because unit cell 250 does not include green image pixels 210. Color correction operations (using a CCM, for example) may be performed on the white image signals generated by clear image pixels to extract a green image signal. If care is not taken, color correction operations can undesirably amplify noise.

In one suitable arrangement, noise generated by the CCM may be reduced by implementing strong de-noising (e.g., chroma de-noising) prior to applying the CCM to gathered image signals. Chroma de-noising may be performed by processing circuitry 18 (as shown in FIG. 1, for example) by applying a chroma filter to image signals gathered by image pixels 210. The chroma filter may serve to increase noise correlation between image signals from different colored image pixels (e.g., red, white, and blue image signals). Increasing noise correlation between image signals from different colored image pixels may reduce noise amplification by the CCM, leading to improved final image quality. In another arrangement, noise amplified by the CCM may be compensated for by applying a so-called "point filter" to the captured image signals. The point filter may use high fidelity white image signals to enhance the quality of red, green, and blue image signals produced using the CCM. If desired, image sensor 16 may implement both chroma de-noising and the point filter to reduce noise amplification by the CCM to yield improved luminance performance in the final image. De-noising operations may generate de-noised image signals. An example of processing that may be performed to reduce noise in image signals can be found commonly-assigned U.S. patent application Ser. No. 13/736,768 to Mlinar et al., which is hereby incorporated by reference herein in its entirety.

Figure 6:
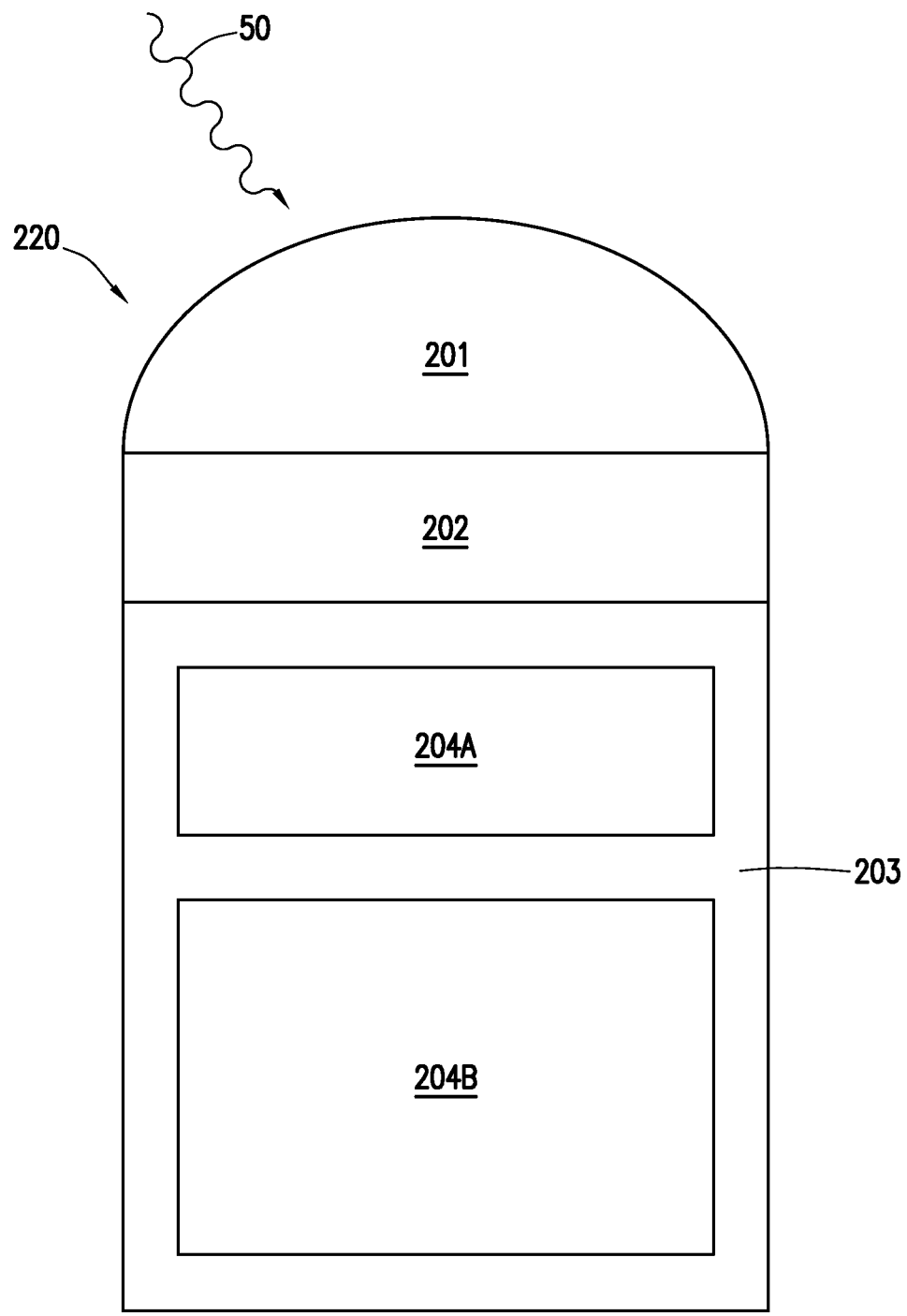
FIG. 6 is a diagram of an illustrative example of an image sensor pixel having stacked photodiodes in accordance with an embodiment of the present invention.

A cross-sectional view of an illustrative stacked photodiode image sensor pixel 220 (sometimes referred to herein as a dual photodiode pixel 220 or stacked photodiode pixel 220) that may form one or more pixels 200 in pixel array 100 is shown in FIG. 6. Stacked photodiode pixel 220 may be provided with a microlens 201, a color filter 202, a first photosensitive portion such as a first photodiode 204A (sometimes referred to herein as shallow photodiode 204A) formed in silicon wafer 203, and a second photosensitive portion such as a second photodiode 204B (sometimes referred to herein as deep photodiode 204B) formed in silicon wafer 203.

Different wavelengths of light 50 may be absorbed at different depths in silicon 203. For example, blue light may be absorbed at principally at shallow depths, whereas green light may on average travel further before being absorbed, and red light may penetrate most deeply. Because shallow photodiode and deep photodiode 204B are located at different depths in silicon 203, shallow photodiode 204A and deep photodiode 204B may be configured to absorb different colors of light and generate signals representative of the different colors of light. Each of photodiodes 204A and 204B may be separately read out to generate separate signals that are representative of the color of light that they are configured to detect.

In an illustrative scenario that is sometimes described herein as an example, shallow photodiode 204A may be formed in silicon 203 at a depth such that shallow photodiode 204A is configured to absorb blue light, and deep photodiode 204B may be formed in silicon 203 at a depth such that deep photodiode 204B is configured to absorb red light. A stacked image pixel 220 having such a configuration may be referred to as a magenta pixel 220. Because there is at least one degree of spectral separation between the light that each of photodiodes 204A and 204B is configured to detect (i.e., neither photodiode is configured to detect green light), blue light that is not absorbed by photodiode 204A may not penetrate silicon 203 to a sufficient depth to reach photodiode 204B, and red light may sufficiently penetrate silicon 203 as to not be substantially absorbed in shallow photodiode 204A. Contrarily, photodiodes in image pixels having three photodiodes stacked in succession are not provided with sufficient depth separation to ensure that light (e.g. blue light) that is not absorbed by the blue photodiode (i.e., the shallowest photodiode in the stackup) is not inadvertently absorbed ty the green photodiode (i.e., the next shallowest photodiode in the stackup). By forming shallow photodiode 204A and deep photodiode 204B at sufficiently different depths, photodiodes 204A and 204B may generate image signals that more accurately reflect the color of light that the photodiode is configured to detect.

A magenta pixel 220 as described above may be provided with a magenta color filter 202 that is configured to pass red and blue light while blocking green light. In this way, magenta color filter 202 may prevent green light from reaching shallow photodiode 204A and deep photodiode 204B, reducing the amount of green light absorbed by the photodiodes. This may reduce signals indicative of green light that are (inadvertently) output by the photodiodes. By forming a magenta image pixel having sufficient depth separation between the blue and red photodiodes and a magenta color filter that blocks green light, a single magenta image pixel 220 may generate both blue image signals in response to blue light and red image signals in response to red light.

Figure 7:
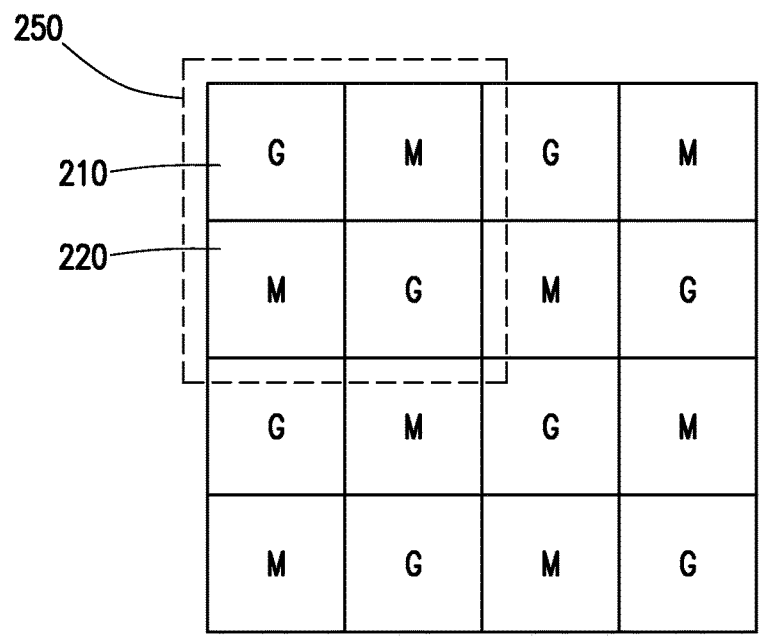
FIGS. 7-15 are diagrams of illustrative arrangements of image sensor pixels and stacked photodiode pixels of the types shown in FIGS. 3 and 6 in accordance with embodiments of the present invention.

In one suitable scenario that is sometimes discussed herein as an example, the red and blue pixels in a Bayer pattern are replaced by magenta stacked photodiode pixels 220 as shown in FIG. 7. As shown in FIG. 7, a unit cell 250 of image pixels 210 and dual photodiode pixels 220 may be formed from two green image pixels (sometimes referred to herein as green (G) image pixels) that are diagonally opposite one another and adjacent to two magenta (M) image pixels that are diagonally opposite each other (i.e., two diagonally opposed magenta pixels). Unit cell 250 may be repeated across image pixel array 100 to form a mosaic of green pixels 210 and magenta pixels 220. In this way, magenta image pixels may generate red image signals in response to red light and blue image signals in response to blue light, and green image pixels may generate green image signals in response to green light. In such an arrangement, the number of red and blue sampling positions in pixel array 100 may be doubled compared to the unit cell arrangements shown in FIGS. 4 and 5, for example. By increasing the spatial frequency of pixels 200 that sample red and blue light, color artifacts may be reduced and signal-to-noise ratio (SNR) for red and blue light may be increased.

Figure 8:
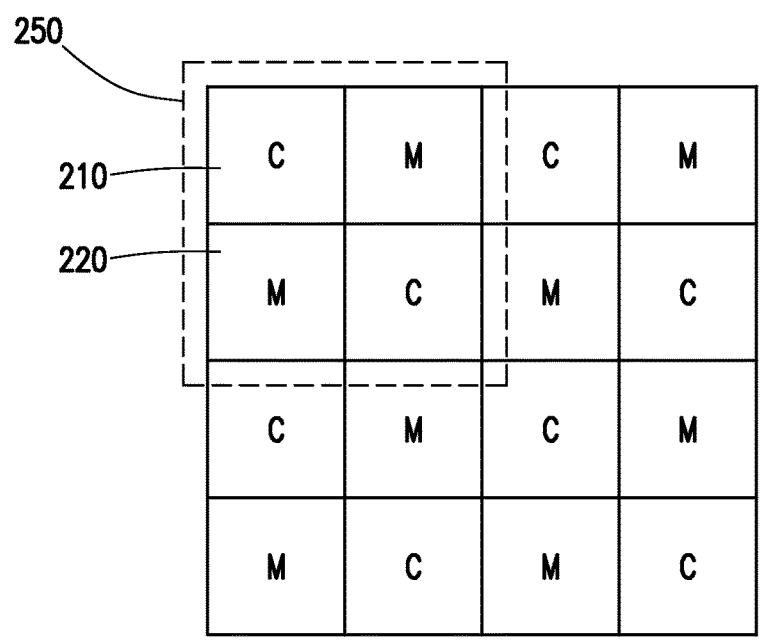

In one suitable scenario that is sometimes discussed herein as an example, the green pixels in a Bayer pattern are replaced by clear image pixels 210 and the red and blue image pixels in a Bayer pattern are replaced with magenta dual photodiode pixels 220. As shown in FIG. 8, a unit cell 250 of clear image pixels 210 and stacked magenta pixels 220 may be formed from two clear image pixels (C) that are diagonally opposite one another and adjacent to two magenta (M) image pixels. In this way, magenta image pixels 220 may generate red image signals in response to red light and blue image signals in response to blue light, and clear image pixels 210 may generate white image signals in response to white light. As described above in connection with FIG. 5, a green image signal may be determined using the white, red, and blue image signals. Clear image pixels C can help increase the signal-to-noise ratio (SNR) of image signals captured by image pixels 210 by gathering additional light in comparison with image pixels having a narrower color filter (e.g., a filter that transmits light over a subset of the visible light spectrum), such as green image pixels. Clear image pixels C may particularly improve SNR in low light conditions in which the SNR can sometimes limit image quality. Image signals gathered from image pixel array 100 having clear image pixels 210 may be converted to red, green, and blue image signals to be compatible with circuitry and software that is used to drive most image displays (e.g., display screens, monitors, etc.). In an arrangement such as that shown in FIG. 8, the number of red and blue sampling positions in pixel array 100 may be doubled compared to unit cell patterns as shown in FIGS. 4 and 5, for example. By increasing the spatial frequency of pixels 200 that sample red and blue light, color artifacts may be reduced and signal-to-noise ratio (SNR) for red and blue light may be increased.

Figure 9:
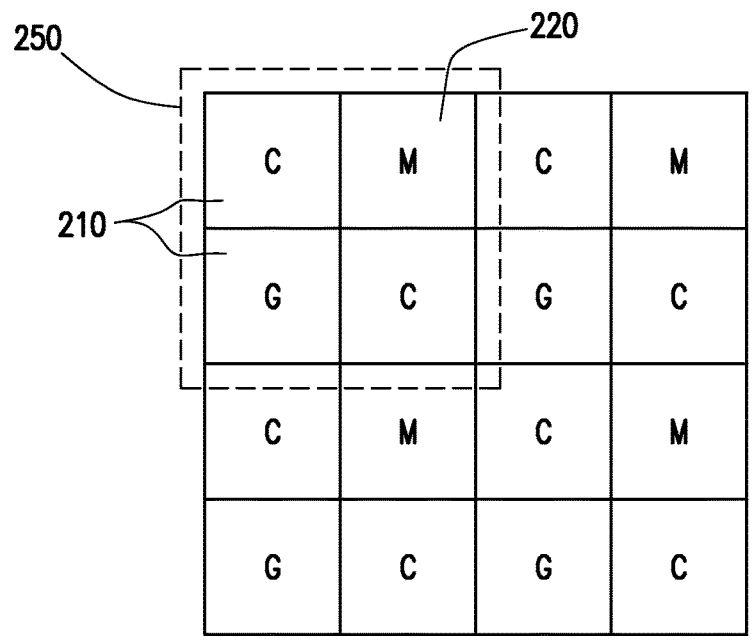

In an illustrative arrangement that is sometimes discussed herein as an example, the green pixels in a Bayer pattern are replaced by clear image pixels 210 and the red and blue image pixels in a Bayer pattern are replaced with green image sensor pixels 210 and magenta dual photodiode pixels 220 as shown in FIG. 9. In FIG. 9, a unit cell 250 of clear image pixels 210, green image pixels 210, and magenta stacked image sensor pixels 220 may be formed from two clear image pixels that are diagonally opposite one another and adjacent to a magenta (M) dual photodiode pixel that is diagonally opposite to a green (G) image pixel (i.e., diagonally opposed magenta and green pixels). In this way, magenta image pixels 220 may generate both red image signals in response to red light and blue image signals in response to blue light, green image pixels 210 may generate green image signals in response to green light, and clear image pixels 210 may generate white image signals in response to white light. As described above in connection with FIG. 5, clear image pixels C can help increase the signal-to-noise ratio (SNR) of image signals captured by image pixels 210 by gathering additional light in comparison with image pixels having a narrower color filter and may particularly improve SNR in low light conditions in which the SNR can sometimes limit image quality. In the example of FIG. 9, the presence of green image pixels 210 may reduce the need to determine green image signals from the white image signals, thereby reducing the strength of the color correction matrix that is applied to the clear image pixel signals in order to generate green image signals. In this way, images captured by an image pixel array having pixels arranged in the configuration of FIG. 9 may demonstrate improved robustness through reduced coloration of veiling glare and local lens flare, decreased color mottle, and generally reduced sensitivity to signal errors such as offsets and non-linearities. In the example described above in connection with FIG. 9, red, blue, green, and white image signals may all be generated using the four pixels in a single unit cell 250. By including magenta stacked photodiode pixels 220 in unit cell 250, one image pixel may be used to generate both the red and blue signals at the same spatial frequency as in a typical Bayer pattern (i.e., the number of red and blue sampling sites remains constant), which allows for the addition of a green pixel that generates green image signals. This arrangement allows for a quasi-Bayer pattern in which two clear image pixels 210 are positioned diagonally opposite from each other in the unit cell 250, maintaining the benefits of the Bayer pattern such as simplified image processing, demosaicing, and bad pixel correction to be realized. The stacked dual photodiode of the magenta pixel allows for the generation of five image signals (red, blue, green, and two white signals) in a two-by-two unit cell that ordinarily only allows for four different signals to be generated.

If desired, image signals generated by clear image pixels 210 may be used to generate a luma signal for images captured using camera module 12. Because clear image pixels 210 capture red, green, and blue light, a luma signal that is based on the full visible spectrum may be generated using white image signals. In examples in which the unit cell 250 includes pixels that generate signals in response to other colors of light (e.g., green image pixels 210 of FIG. 9), such image signals (e.g., green image signals) may be used to generate a luma signal. Multiple luma signals (e.g., a luma signal generated based on a white signal and a luma signal generated based on a green signal) may be combined to form a composite luma signal. In arrangements that allow for both clear and green pixels to be formed in the same unit cell (such as in FIG. 9, for example), multiple luma channels generated from pixels in close spatial proximity to each other may be available, allowing for a high-quality composite luma signal to be generated.

It may be desirable to provide an image sensor 16 with the ability to detect light in the infrared (IR) region of the electromagnetic spectrum. For example, an image sensor 16 may be provided with image pixels 210 having color filters 202 that are configured to allow light having infrared wavelengths to pass, while blocking out light in all or a portion of the visible region of the spectrum. In such an example, photodiode 204 may generate a signal that is indicative of infrared light received at infrared pixel 210. For example, an infrared image pixel 210 may be provided with a color filter 202 that allows near-infrared (NIR) light to pass. Such near-infrared image pixels 210 may provide image sensor 16 with the ability to detect infrared light in night-vision, user gesture detection, and other IR applications. For example, an electronic device 10 that includes NIR image pixels 210 may further be provided with an infrared light source (e.g., at least one LED or other suitable light source) that emits infrared light into an environment in which camera module 12 may capture images. The NIR signals generated by NIR image pixels 210 in response to the infrared light emitted by the IR light source may be used for gesture detection and other suitable applications.

Figure 10:
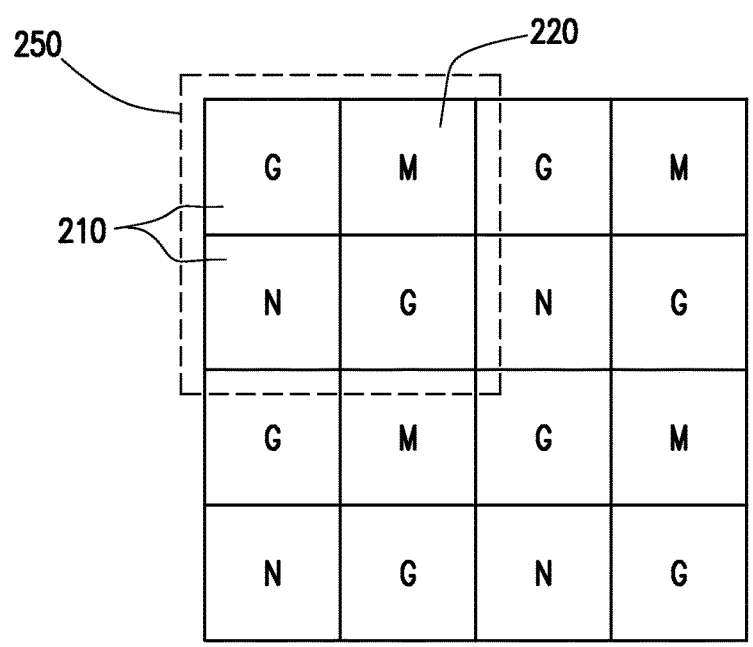

In one exemplary arrangement that is sometimes discussed herein as an example, the red and blue pixels in a Bayer pattern are replaced by magenta stacked photodiode pixels and near-infrared image pixels as shown in FIG. 10. For example, a unit cell 250 of image pixels 210 and dual photodiode pixels 220 may be formed from two green image pixels that are diagonally opposite one another and adjacent to a magenta (M) image pixel and a near-infrared (N) image pixel that are diagonally opposite each other (i.e., diagonally opposed magenta and NIR pixels). Unit cell 250 may be repeated across image pixel array 100 to form a mosaic of green and NIR image pixels 210 and magenta dual-photodiode pixels 220. In this way, magenta image pixels may generate red image signals in response to red light and blue image signals in response to blue light, and green image pixels may generate green image signals in response to green light. NIR image pixels 210 may generate near-infrared signals in response to light in the near-infrared region of the spectrum. In such an arrangement, the number of red and blue sampling positions in pixel array 100 may be maintained at the same number as in unit cell patterns shown in FIGS. 4 and 5 (as examples). Such an arrangement further provides sensitivity to the near-infrared region of the spectrum, allowing an image sensor 16 that incorporates pixels arranged as shown in FIG. 10 to function as a vis-NIR sensor. In color-critical applications, the green and magenta pixels may have color filters incorporating absorbers of NIR radiation, to minimize impact on color reproduction in illuminants containing both visible and infrared radiation.

Figure 11:
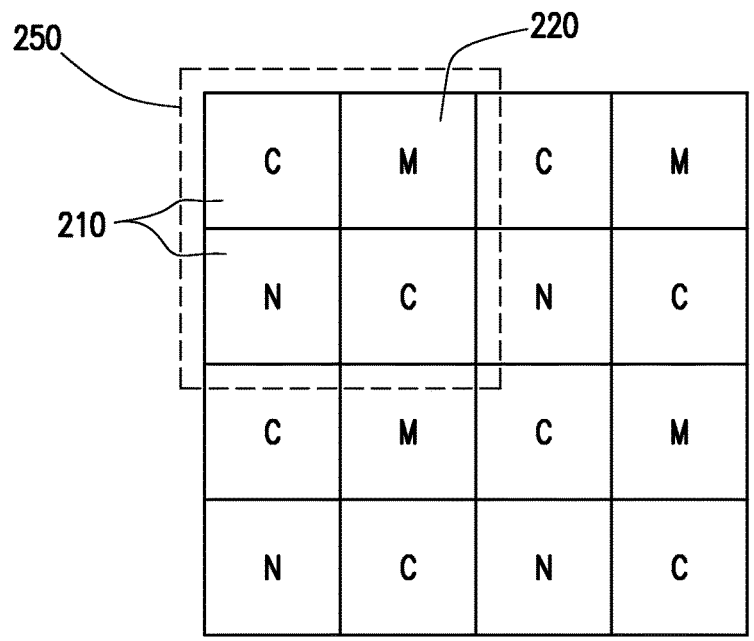

If desired, the red and blue pixels in a Bayer pattern may be replaced by magenta stacked photodiode pixels and near-infrared image pixels (as shown in FIG. 10), and the green pixels in the Bayer pattern may be replaced by clear pixels. An example of such an arrangement is shown in FIG. 11, in which a unit cell 250 of image pixels 210 and dual photodiode pixels 220 may be formed from two clear (C) image pixels that are diagonally opposite one another and adjacent to a magenta (M) image pixel and a near-infrared (N) image pixel that are diagonally opposite each other. Unit cell 250 may be repeated across image pixel array 100 to form a mosaic of clear and NIR image pixels 210 and magenta dual photodiode pixels 220. In this way, magenta image pixels may generate red image signals in response to red light and blue image signals in response to blue light. Clear image pixels may generate white signals that may be used as a luma signal and/or may be processed to generate color image signals (e.g., a green color image signal, as described above in connection with FIG. 5). NIR image pixels 210 may generate near-infrared signals in response to light in the near-infrared region of the spectrum. In such an arrangement, the number of red and blue sampling positions in pixel array 100 may be maintained at the same number as unit cells shown in FIGS. 4 and 5, for example, while providing sensitivity to the near-infrared region of the spectrum. Image sensor 16 that incorporates pixels arranged as shown in FIG. 11 may function as a vis-NIR sensor.

It may be desirable to provide a stacked photodiode pixel 220 that is capable of detecting light in both the visible and infrared spectrums. For example, a stacked photodiode 220 may be provided with a shallow photodiode 204A that is configured to detect light in the visible region of the spectrum (e.g., red light, blue light, green light, white light, etc.) and a deep photodiode 204B that is configured to detect light in the infrared region of the spectrum. As described above in connection with FIG. 6, blue light is typically absorbed at the shallowest depth, green light at an intermediate depth, and red light at the greatest depth in silicon wafer 203. NIR light is typically absorbed at a depth in silicon wafer 203 that is deeper than the depth at which red light is absorbed. In this way, shallow photodiode 204A and deep photodiode 204B may be configured to absorb light having wavelengths that are spectrally separated (e.g., wavelengths of light that are not adjacent in the electromagnetic spectrum and that are absorbed at different depths in silicon) such that light that is intended to be absorbed by shallow photodiode 204A but that that is transmitted to a greater depth in the silicon than intended the will be absorbed prior to reaching deep photodiode 204B.

In one example, a stacked photodiode pixel 220 having NIR sensitivity may be provided with a shallow photodiode 204A that is configured to absorb blue light and generate blue light signals, and a deep photodiode 204B that is configured to absorb near-infrared light and generate near-infrared light signals. Such a stacked photodiode 220 may be provided with a blue color filter 202 that only allows blue light to pass while still providing good NIR transmissivity. Moreover, the blue light and NIR light demonstrate spectral separation such that deep photodiode 204B is less susceptible to inadvertently receiving blue light that is transmitted deeper than shallow photodiode 204A.

Figure 12:
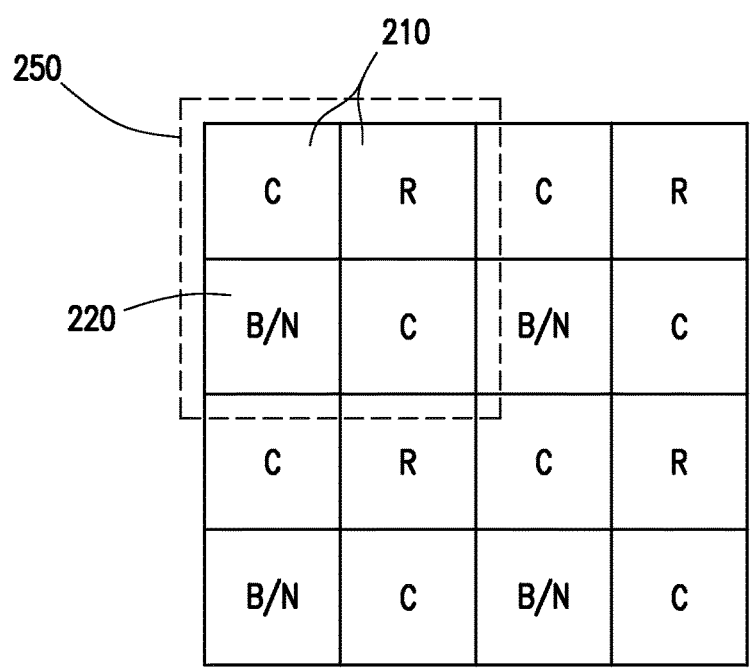

An illustrative example of a unit cell 250 that includes a stacked dual photodiode 220 having both blue and infrared sensitivity is shown in FIG. 12. Here, the green pixels in a Bayer pattern are replaced by clear image pixels, and the blue image pixels of a Bayer pattern are replaced with blue/NIR stacked dual photodiode pixels. As shown in FIG. 12, a unit cell 250 of image pixels 210 and stacked photodiode pixels 220 may be formed from two clear (C) image pixels that are diagonally opposite one another and adjacent to a red (R) image pixel that is diagonally opposite to a stacked blue/NIR (B/N) dual photodiode pixel (i.e., diagonally opposed red and stacked blue/NIR pixels). Unit cell 250 may be repeated across image pixel array 100 to form a mosaic of red and clear image pixels 210 and blue/NIR stacked dual photodiode pixels 220. In this way, red image pixels may generate red image signals in response to red light and clear image pixels may generate white image signals in response to white light. Blue/NIR image pixels may generate blue image signals in response to blue light and NIR image signals in response to NIR light. As described above in connection with FIG. 5, green image signals may be determined from the white image signals using filtering, de-noising, and color correction operations. In this way, five different image signals (one each of red, blue, and NIR, and two white) may be generated in a two-by-two unit cell that ordinarily only allows for four different signals to be generated. Such an arrangement allows for the functionality of the two-by-two pattern shown in FIG. 5 to be maintained while providing the image sensor with infrared sensitivity.

In one example, a stacked photodiode pixel 220 having NIR sensitivity may be provided with a shallow photodiode 204A that is configured to absorb green light and generate green light signals, and a deep photodiode 204B that is configured to absorb near-infrared light and generate near-infrared light signals. Such a stacked photodiode 220 may be provided with a green color filter 202 that only allows green light to pass while still providing good NIR transmissivity. Moreover, the green light and NIR light demonstrate spectral separation such that deep photodiode 204B is less susceptible to inadvertently receiving green light that is transmitted deeper than shallow photodiode 204A. It may be possible to integrate stacked photodiode pixels 220 having green/NIR sensitivity into a unit cell (e.g., a unit cell as shown in the Bayer pattern of FIG. 4) at a higher spatial frequency than the blue/NIR stacked photodiode pixels 220 described above in connection with FIG. 12.

Figure 13:
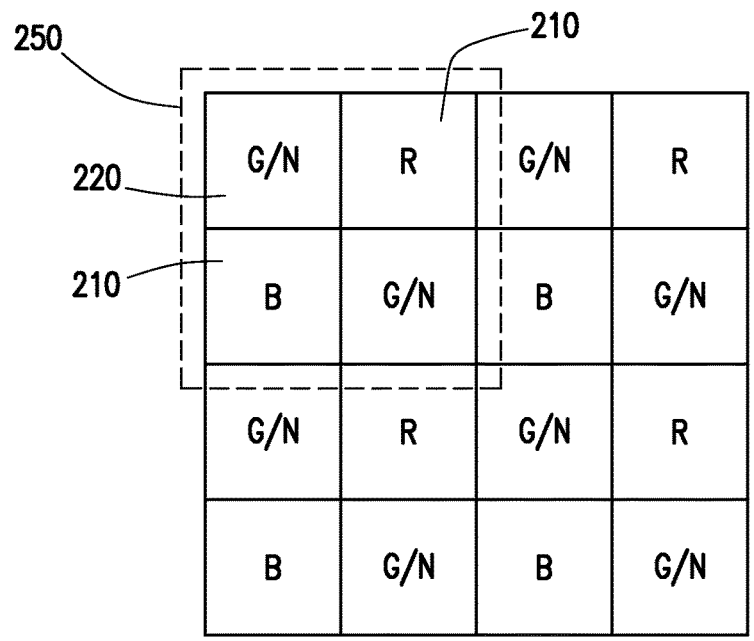

For example, an illustrative example of a unit cell 250 that includes a stacked dual photodiode pixel 220 having both green and infrared sensitivity is shown in FIG. 13. Here, the green pixels in a Bayer pattern are replaced by green/NIR stacked dual photodiode pixels 220, forming a unit cell 250 of image pixels 210 and stacked dual photodiode pixels 220 from two green/NIR (G/N) stacked photodiode pixels that are diagonally opposite one another and adjacent to a red (R) image pixel that is diagonally opposite to a blue (B) image pixel (i.e., diagonally opposed red and blue pixels). Unit cell 250 may be repeated across image pixel array 100 to form a mosaic of red and blue image pixels 210 and green/NIR stacked dual photodiode pixels 220. In this way, red image pixels may generate red image signals in response to red light and blue image pixels may generate blue image signals in response to blue light. Green/NIR image pixels may generate green image signals in response to green light and NIR image signals in response to NIR light. In this way, six different image signals (red, blue, two green, and two NIR signals) may be generated in a two-by-two unit cell that ordinarily only allows for four different signals to be generated. Here, a characteristic Bayer pattern (as shown in FIG. 4) is maintained while providing the image sensor with infrared sensitivity.

Figure 14:
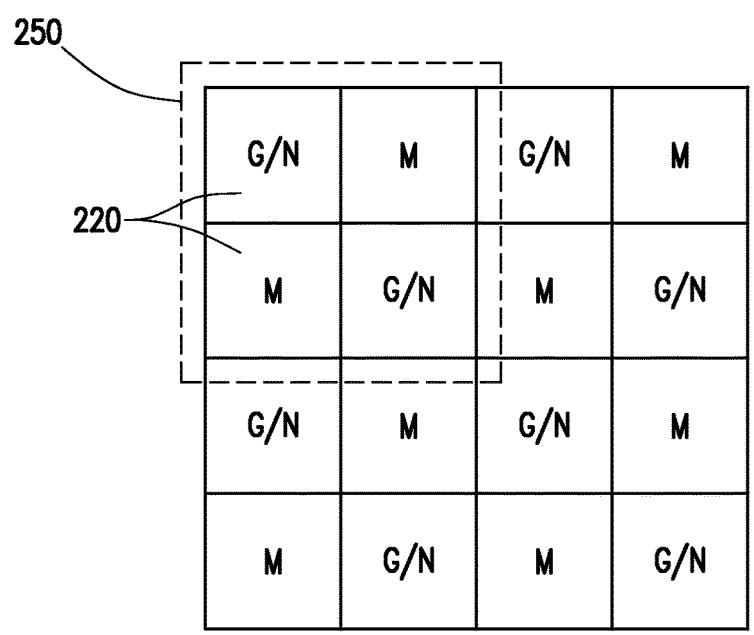

As discussed above in connection with FIG. 7, the red and blue pixels in a Bayer pattern may be replaced by magenta image pixels. If desired, the green image pixels in an arrangement such as that shown in FIG. 7 may be replaced with green/NIR stacked dual photodiode pixels 220, as shown in FIG. 14. In such an example, a unit cell 250 of image pixels 210 and dual photodiode pixels 220 may be formed from two green/NIR (G/N) dual photodiode pixels that are diagonally opposite one another and adjacent to two magenta (M) image pixels that are diagonally opposite each other. Unit cell 250 may be repeated across image pixel array 100 to form a mosaic of green/NIR stacked photodiode pixels 220 and magenta stacked photodiode pixels 220. That is, unit cell 250 and/or pixel array 100 may be made up entirely of dual photodiode image pixels 220. In this way, magenta image pixels may generate red image signals in response to red light and blue image signals in response to blue light, and green/NIR image pixels may generate green image signals in response to green light and near-infrared image signals in response to near-infrared light. In such an arrangement, the number of red and blue sampling positions in pixel array 100 may be doubled compared to a unit cell pattern as shown in FIGS. 4 and/or 5, for example. Doubling the spatial frequency of red and blue sampling may reduce color artifacts and increase signal-to-noise ratio (SNR) associated with red and blue signals. By replacing green image pixels 210 with green/NIR dual stacked photodiode pixels 220, the number of sampling sites for green light may be maintained at the same frequency as in a Bayer pattern (as shown in FIG. 4) while providing NIR-sensitivity to the image sensor. In this way, eight different image signals (two each of red, blue, green, and NIR) may be generated in a two-by-two unit cell that ordinarily only allows for four different signals to be generated. In such an arrangement, a luma signal may be generated using the green and/or NIR image signals. For example, a composite luma signal may be generated using green image signals and NIR image signals generated using a single pixel 220.

As discussed above in connection with FIG. 9, green pixels in a Bayer pattern may be replaced by clear image pixels 210, and the red and blue image pixels in a Bayer pattern may be replaced with green image sensor pixels 210 and magenta dual photodiode pixels 220 as shown in FIG.

Figure 15:
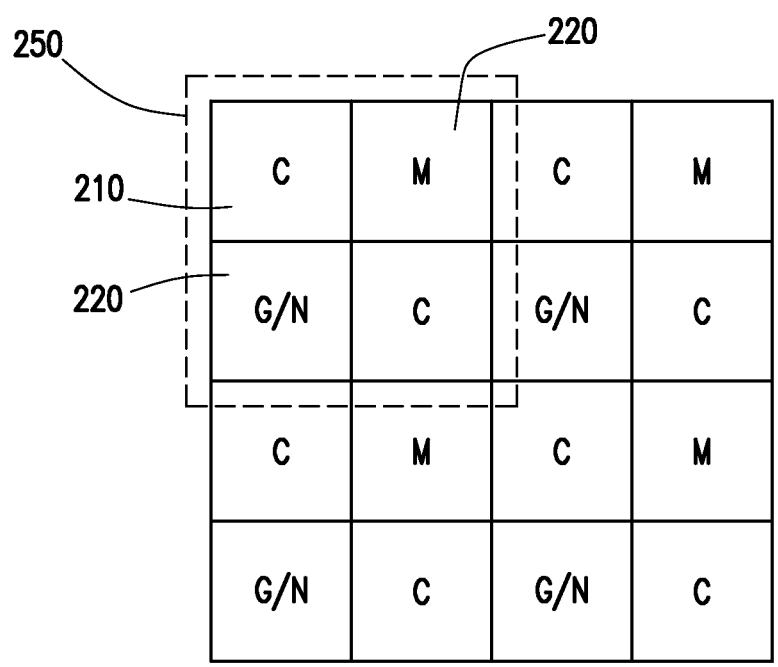

9. If desired, the green image pixels in an arrangement such as that shown in FIG. 9 may be replaced with green/NIR stacked dual photodiode pixels 220 (including a green photodiode 204A and an infrared photodiode 204B, for example), as shown in FIG. 15. In such an example, a unit cell 250 of clear image pixels 210, magenta stacked dual photodiode pixels 220, and green/NIR stacked dual photodiode pixels 220 may be formed from two clear (C) image pixels that are diagonally opposite one another and adjacent to a magenta (M) dual photodiode pixel that is diagonally opposite to a green/NIR (G/N) dual photodiode pixel (i.e., diagonally opposed magenta and green/NIR pixels). In this way, magenta image pixels 220 may generate both red image signals in response to red light and blue image signals in response to blue light and green/NIR pixels 220 may generate both green image signals in response to green light and NIR image signals in response to near-infrared light. Clear image pixels 210 may generate white image signals in response to white light. In this way, clear image pixels C can help increase the signal-to-noise ratio (SNR) of image signals captured by image pixels 210 and stacked photodiode pixels 220 and improve SNR in low light conditions in which the SNR can sometimes limit image quality. As described above in connection with FIG. 9, the presence of green image signals generated by green/NIR image pixels 220 may reduce the need to determine green image signals from the white image signals, thereby reducing the strength of the color correction matrix that is applied to the clear image pixel signals in order to generate green image signals. In the example described above in connection with FIG. 15, red, blue, green, white, and NIR image signals may be generated using the four pixels in a single unit cell 250. By including magenta stacked photodiode pixels 220 in unit cell 250, one image pixel may be used to generate both the red and blue signals at the same spatial frequency as in a typical Bayer pattern (i.e., the number of red and blue sampling sites remains constant), which allows for the addition of a green/NIR pixel that generates both green and near-infrared image signals. The stacked dual photodiodes of the green/NIR pixel and the magenta pixel allow for the generation of six image signals (red, blue, green, near-infrared, and two white signals) in a two-by-two unit cell that ordinarily only allows for four different signals to be generated. In such an arrangement, multiple channels from which a luma signal may be generated are available. For example, the green image signals, infrared image signals, and white image signals may all be suitable for generating a luma signal. If desired, more than one or each of the green, white, and/or infrared channels may be used to generate respective luma signals that may be combined to form a high-fidelity composite luma signal.

Figure 16:
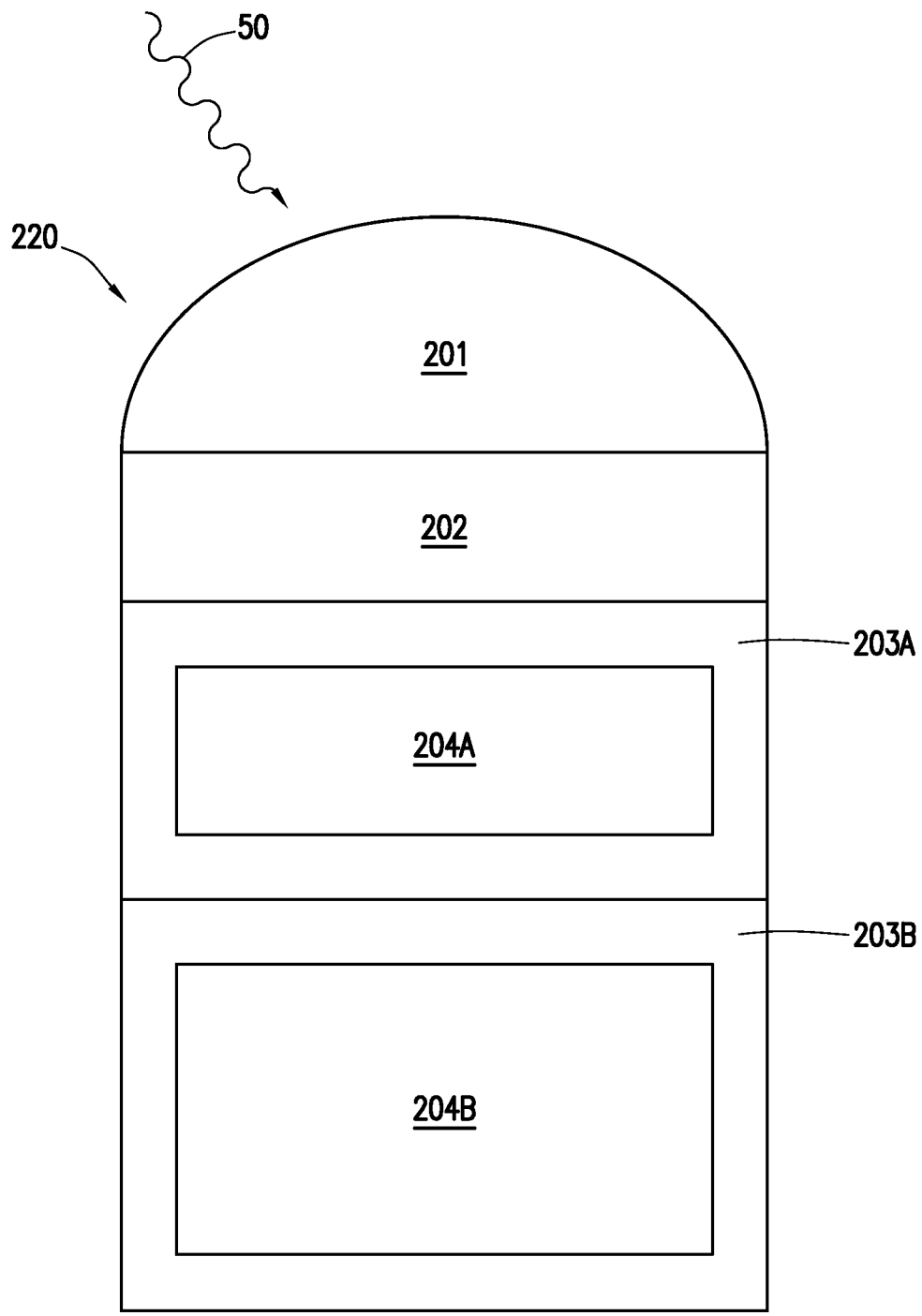
FIG. 16 is a diagram of an illustrative example of an image sensor pixel having stacked photodiodes in accordance with an embodiment of the present invention.

Infrared light may travel deeper into silicon wafer 203 than blue, green, or red light. That is, the attenuation of NIR light in silicon is more gradual than that of the light in the visible spectrum. It may therefore be desirable to form photodiodes that are adapted to detect NIR light relatively deep in the silicon substrate of an image pixel. In the example in which deep photodiode 204B of stacked dual photodiode pixel 220 is configured to absorb NIR light, it may be desirable to at least partially form deep photodiode 204B on a separate silicon wafer. An illustrative example of a shallow photodiode 204A and deep photodiode 204B formed on different silicon wafers is shown in FIG. 16. Here, shallow photodiode 204A is formed in first silicon wafer 203A (sometimes referred to herein as shallow silicon wafer 203A, first substrate 203A, or shallow substrate 203A), and deep photodiode 204B is formed in second silicon wafer (sometimes referred to herein as deep silicon wafer 203B, second substrate 203B, or deep substrate 203B) that may be bonded or otherwise attached to first silicon wafer 203A. As shown in FIG. 16, deep silicon wafer 203B may be formed beneath (i.e., deeper than) shallow silicon wafer 203A. In such an arrangement, shallow wafer 203A and deep wafer 203B may be controlled and read out by separate circuitry. Such an arrangement may help ensure that the respective wavelengths of light received at stacked image pixel 220 reach their respective photodiodes 204A and 204B while simplifying control and readout of the signals from each of the photodiodes. If desired, shallow photodiode 204A formed in shallow wafer 203A may be configured to absorb light having a visible wavelength (e.g., green light or blue light) and deep photodiode 204B formed in deep photodiode 204B may be configured to absorb light having an infrared wavelength. This, however, is merely illustrative. If desired, each of first and second photodiodes 204A and 204B formed in first and second substrates 203A and 203B, respectively, may be both be configured to absorb light in the visible spectrum (e.g., each photodiode may be configured to absorb light of a different color).

As described above in connection with FIG. 6, shallow photodiode 204A and deep photodiode 204B may be formed at sufficiently different depths in silicon wafer 203 to reduce the amount of light that is configured to be absorbed by shallow photodiode 204A, but that is inadvertently transmitted through the silicon to deep photodiode 204B. Even in such an arrangement, however, some light of the wavelength configured to be absorbed by shallow photodiode 204A may pass through shallow photodiode 204A and be absorbed by deep photodiode 204B. Similarly, some of the light of the wavelength configured to be absorbed by deep photodiode 204B may be prematurely attenuated and absorbed by shallow photodiode 204A. For example, in the illustrative embodiment of a magenta stacked dual photodiode pixel 220 in which shallow photodiode 204A is configured to detect blue light and generate a blue image signal and deep photodiode 204B is configured to detect red light and generate a red image signal, blue photodiode 204A may absorb at least some of the red light intended to be absorbed by red photodiode 204B, and red photodiode 204B may absorb at least some of the light intended to be absorbed by blue photodiode 204A. In this way, the image signal (i.e., a blue mixed image signal) generated by shallow photodiode 204A may undesirably include an image signal component that is representative of a color of light (e.g. red) other than the color of light for which a signal is desired. Similarly, the image signal (i.e., a red mixed image signal) generated by deep photodiode 204B may undesirably include an image signal component that is representative of a color of light (e.g. blue) other than the color of light for which a measurement is desired.

A color correction matrix (CCM) may be applied to the mixed image signal from shallow photodiode 204A and deep photodiode 204B to extract the desired signal (e.g., a blue image signal and/or red image signal) from the mixed image signal. Because such CCM operations may undesirably amplify noise, it may be desirable to perform de-noising operations on the image signals generated by shallow photodiode 204A and deep photodiode 204B.

Figure 17:
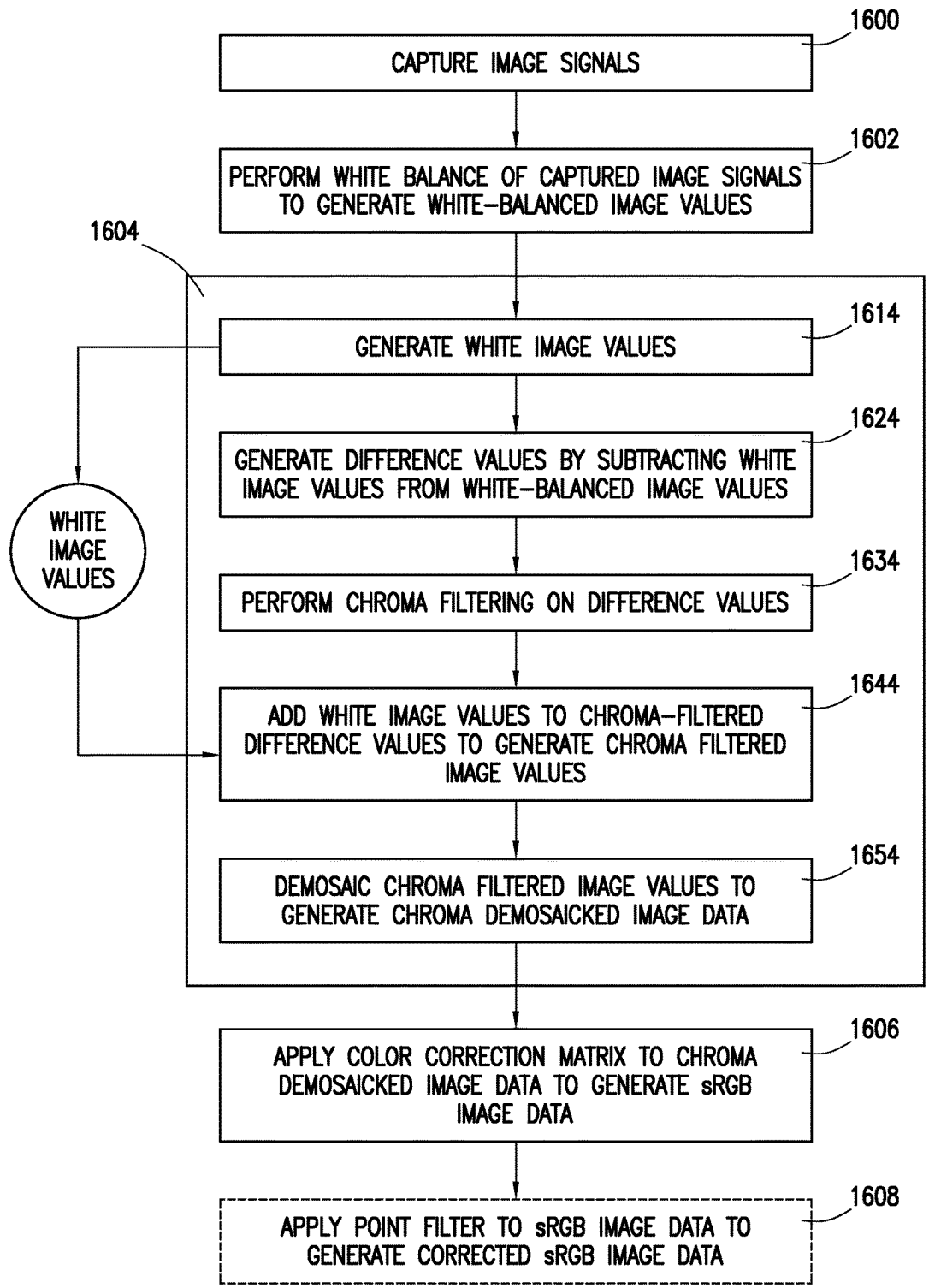
FIG. 17 is a flow chart of illustrative steps that may be performed in extracting and de-noising image signals generated by pixels of the types shown in FIGS. 3 and 6 in accordance with an embodiment of the present invention.

A flow chart of illustrative steps that may be performed in de-noising and extracting image signal data generated by a stacked dual photodiode pixel 220 is shown in FIG. 17.

At step 1600, image sensor 16 may capture image signals from a scene. The image signals captured by image sensor 16 may include mixed signals generated by a shallow photodiode 204A and/or deep photodiode 204B in stacked dual photodiode pixel 220. If desired, the image signals may also include one or more of white image signals, red image signals, blue image signals, green image signals, near-infrared image signals, or any other suitable image signals depending on the configuration (i.e., unit cell 250) of the pixels. In an illustrative example in which a pixel array 100 includes a cell block of the type shown in FIG. 9, mixed red (RX'), mixed blue (BX'), white (C'), and green (G'), image signals may be captured. The captured image signals may be conveyed to processing circuitry 18 for image processing.

At step 1602, a white balance operation may be performed on the captured image signals. In the example of FIG. 9, a white-balanced mixed red image signal (RX), a white-balanced blue image signal (BX), a white-balanced white image signal (C), and a white-balanced green image signal (G), may be produced.

At step 1604, processing circuitry 18 may demosaic and apply a chroma filter to the white-balanced image signals to extract mixed red, mixed blue, green, and white image data from the white-balanced image signals. The chroma filter may be applied to chroma de-noise the white-balanced image signals. Processing circuitry 18 may, for example, demosaic the image signals and apply the chroma filter simultaneously, sequentially, or in an interspersed manner. This process of applying a chroma filter and demosaicking the image signals may sometimes be referred to herein as "chroma demosaicking." The chroma filter may increase noise correlation between image signals of each color (e.g., noise fluctuations in the mixed red, mixed blue, green, and white channels may increase or decrease together in a correlated manner). For example, processing circuitry 18 may increase the correlated noise between the mixed red, mixed blue, green, and white image signals to as much as 70% or more of all noise associated with the mixed red, mixed blue, green, and white image signals.

By increasing noise correlation, processing circuitry 18 may reduce the amount of noise amplification generated when a CCM is applied to the image signals. Chroma demosaicking the image signals may allow individual components of mixed image signals (e.g., the isolated blue component of a mixed blue image signal or the isolated red component of a mixed red image signal) to be determined from available color image signals. In this example, an isolated blue image signal and/or an isolated red image signal may be missing from the gathered image signals because the image signals generated by shallow photodiode 204A and deep photodiode 204B include both blue image signal components and red image signal components. A blue image signal may be determined using the white, mixed red, and green image signals (e.g., by performing subtraction operations). A red image signal may be determined using the white, mixed blue, and green image signals (e.g., by performing subtraction operations). Further details of the demosaicking and filtering operations that may be performed in connection with step 1604 are provided below.

At step 1614, processing circuitry 18 may produce white image data (e.g., a white image value for each image pixel). In one suitable example, processing circuitry 18 may demosaic the white image signal to produce white image data (e.g., a white image value or luma signal for each pixel). In another suitable arrangement, white image values (i.e., luma signals) may be generated based on green image signals generated by green image sensor pixels 210. In examples in which image sensor 16 is configured to detect infrared light (in arrangements such as those shown in FIGS. 10-15, for example) the near-infrared signals generated by infrared image pixels 210 may be used as a luma signal. If desired, multiple luma signals (e.g., luma signals generated based on clear image pixel data generated by clear image pixels, based on green image pixel data generated by green image pixels, and/or based on NIR image signals generated by NIR pixels) may be determined and combined to generate a high-quality composite white image (luma) signal. The white image values may be used to compute difference values using the mixed red and mixed blue image signals to increase noise correlation between the mixed red, mixed blue, and white image signals.

At step 1624, processing circuitry 18 may generate mixed red difference values by subtracting the white image values from the mixed red image values (e.g., the white-balanced mixed red image values generated in step 1602). Processing circuitry 18 may generate mixed blue difference values by subtracting the white image values from the mixed blue image values (e.g., the white-balanced mixed blue image values generated in step 1602). The mixed red and mixed blue difference values may, for example, be computed for each stacked photodiode pixel 220.

At step 1634, processing circuitry 18 may filter the mixed red difference values and the mixed blue difference values using a chroma filter. The chroma filter may be applied to the mixed red and mixed blue difference values by, for example, performing a weighted average of difference values computed over a kernel of image pixels 210 and/or stacked pixels 220 (e.g., a weighted average of a group of difference values that were computed by performing step 112). The kernel of image pixels may be defined as a subset of the pixels 200 in image pixel array 100 over which the chroma filtering is being performed (e.g., the kernel may include some or all of the pixels 200 in image pixel array 100). For example, when a 5 pixel by 5 pixel kernel is used, a weighted average of difference values is calculated for a 5 pixel by 5 pixel subset of pixels 200 in image pixel array 100 when performing chroma filtering (e.g., a weighted sum of difference values may be computed for a given pixel 200 using difference values at 25 surrounding image pixels in image pixel array 100). In general, a kernel of any desired size may be used. It may be advantageous to use larger kernels in portions of scenes that are slowly varying (approximately uniform), for better noise reduction, while using smaller kernels in areas of scene texture, detail, and/or edges, to preserve high-frequency information and sharpness.

At step 1644, the white image values may be added to the chroma filtered mixed red difference values and the chroma filtered mixed blue difference values to generate chroma filtered mixed red image values and chroma filtered mixed blue image values, respectively.

At step 1654, processing circuitry 18 may demosaic the chroma filtered mixed red image values and the chroma filtered mixed blue image values to produce mixed red image data and mixed blue image data (e.g., mixed red and mixed blue image data that has been chroma demosaicked) with increased correlated noise.

At step 1606, processing circuitry 18 may apply a color correction matrix (CCM) to the mixed red image data and the mixed blue image data. The CCM may, for example, extract blue image data from the blue mixed image data to generate isolated blue image data. Similarly, the CCM may extract red image data from the red mixed image data to generate isolated red image data. Green image data may be generated by the green image pixels. For example, the CCM may convert the image data into standard red, standard green, and standard blue image data (sometimes referred to collectively as linear sRGB image data or simply sRGB image data). If desired, gamma correction processes may be performed on the linear sRGB image data. After gamma correction, the sRGB image data may be used for display using an image display device. In some cases, it may be desirable to provide additional noise reduction (e.g., by applying a point filter to the sRGB image data) to further mitigate the noise amplification generated by applying the CCM to the mixed red, mixed blue, and green image data. Processing circuitry 18 may preserve the mixed image data for further processing of the sRGB image data during optional step 1608.

If chroma filtering of the difference values is performed over a sufficiently large kernel of image pixels 200, minimal noise from the mixed red and mixed blue image signals may remain in the mixed red and mixed blue difference values after chroma filtering. For example, if the kernel has a size of 15 pixels by 15 pixels or greater, chroma filtering may reduce noise in the mixed red and mixed blue chroma filtered difference values to negligible levels. If desired, the kernel of image pixels 200 may include image pixels located in multiple image pixel arrays 100, image pixels located in multiple image sensors 16, and/or image pixels used during multiple time frames (e.g., to allow for temporal de-noising). When the white image values are added to the chroma filtered difference values, noise in the white image values may dominate over noise in the difference values. In this way, noise in the mixed red and mixed blue image data produced at step 1644 may be substantially equal to noise in the white image data. Noise in the red and blue image data may thereby be highly correlated, resulting in reduced noise amplification by the CCM. This process may produce less noise amplification by the CCM than when a Bayer pattern is used for image pixel array 100.

The CCM may operate on the mixed red, mixed blue, and green image data to produce linear sRGB data at step 1606. For example, the CCM may extract information from the mixed image data to generate the standard blue data and/or standard red data. The white image data (e.g., the demosaicked white image data or the composite luma signal produced at step 1604) may be preserved after operating on the image data with the CCM. The sRGB image data may be represented in other three-dimensional spaces such as a luminance-chroma-hue (LCH) space. In an LCH space, the luminance channel (L) may be related to the brightness of an image captured by image sensor 16, the chroma channel (C) may be related to the color saturation of an image, and the hue channel may be related to the specific color of the image (e.g., red, purple, yellow, green, etc.). The perception of noise and sharpness in a displayed image may be affected by noise and signal variations in the luminance channel. The SNR in the image data may be improved by transforming the sRGB data to LCH data, replacing a luminance value in the luminance channel with a white image value (which correlates well with overall image brightness due to the broad spectrum of the white image signal), and transforming LCH data back to sRGB data. In this way, noise amplification caused by the CCM may be suppressed in the luminance channel, where noise is particularly noticeable to a viewer when viewing a displayed image.

At optional step 1608, processing circuitry 18 may apply a point filter to the image data (e.g., to the sRGB image data produced after applying the CCM to the mixed red, mixed blue, and green image data). The point filter may operate on the sRGB image data to generate corrected sRGB data. The point filter may serve to further reduce noise amplification caused by applying the CCM to the mixed red, mixed blue, and green image data. When displayed using a display system, the corrected sRGB data thereby provide better image quality (e.g., better luminance performance) when compared to the sRGB data prior to applying the point filter.

The point filter may operate on a single pixel 200 without information from adjacent pixels 200, whereas chroma demosaicking may require image signals (e.g., difference values) from multiple pixels (e.g., a kernel of pixels) when being applied to image signals at a single pixel 200. For example, the point filter may operate on a standard red value, standard green value, and standard blue value for each image pixel. To perform point filter operations on the sRGB data, processing circuitry 18 may use the mixed red image data, mixed blue image data, and green image data (e.g., the image data prior to applying the CCM) to compute an original (raw) luminance signal. The original luminance signal may be a linear combination (e.g., a weighted sum) of the mixed red image data, mixed blue image data, and green image data. If desired, processing circuitry 18 may use the white image data to compute the original luminance signal. In examples in which infrared light signals are generated (e.g., in examples in which pixel array 100 includes NIR-sensitive pixels), the NIR signal contribute to the luminance signal. In general, red, green, blue, white, mixed, and/or NIR image signals may be combined in any suitable manner to generate a robust composite raw luminance signal.

Processing circuitry 18 may compute an implied luminance signal that is a linear combination of the standard red, standard green, and standard blue image data (e.g., after applying the CCM to the image data). If desired, weights in the linear combination used to compute the implied luminance signal may be substantially similar to the weights used to compute the original luminance signal. The weights may be adjusted to modify the "strength" of the point filter (e.g., the degree to which the point filter transforms or corrects the sRGB data).

Processing circuitry 18 may generate a scaling value (e.g., a scaling factor to be applied to color corrected image values) by, in a simplest case, dividing the original (raw) luminance signal by the implied luminance signal. If desired, the scaling factor may include a numerator and denominator. The numerator and/or the denominator of the scaling value may include a weighted sum of the original luminance signal and the implied luminance signal. The scaling value may include adjustable weighting parameters that can be varied to adjust the strength of the point filter (e.g., the weighting parameters may be continuously varied to adjust the strength of the point filter from zero to a full strength). To apply the point filter to the sRGB data (e.g., to the standard red, green, and blue image data), processing circuitry 18 may multiply the sRGB data by the scaling value to produce the corrected sRGB data. For example, processing circuitry 18 may multiply the standard red image data by the scaling value, the standard green image data by the scaling value, etc. If desired, the corrected sRGB data may have hue and chroma channels that are approximately preserved from before applying the point filter (e.g., upon conversion of the corrected sRGB data to LCH space). The corrected sRGB data may have improved noise and/or sharpness due to inherited fidelity of the white image signals.

In a simplest case, the original luminance signal may be approximated by the white image data. If desired, the original luminance signal may be a composite signal including white image signals, green image signals, and/or NIR image signals. Processing circuitry 18 may, for example, apply the point filter to sRGB data for each pixel 200 in image pixel array 100.

Processing circuitry 18 may generate an implied luminance value (e.g., a luminance value in LCH space) for a given image pixel 200 by combining the red, green, blue image data (e.g., after applying a CCM). The implied luminance value may, for example, be computed as a linear combination of the red, green, and blue image data.

Processing circuitry 18 may generate a scaling value by dividing the original luminance signal (i.e., the white image values or other image values used to generate the original luminance signal) by the implied luminance value. If desired, the scaling factor may be generated by dividing the white image values by a weighted sum of the implied luminance value and the white image value. The scaling factor may include adjustable weighting parameters that can be varied to adjust the strength of the point filter (e.g., the weighting parameters may be varied continuously to adjust the strength of the point filter from zero to a full strength). The scaling value may, for example, be an operator that operates on the sRGB data. If desired, the point filter may be applied to image signals generated by shallow photodiode 204A at a first strength and may be applied to image signals generated by shallow photodiode 204B at a second strength. A stronger point filter may be applied to the shallow photodiode signals than the deep photodiode signals (because, for example, the shallow photodiode signals may be more susceptible to absorbing light intended for the deep photodiode). In this way, an image signal having a larger undesirable signal component may be de-noised more aggressively than another image signal that has a lesser undesirable signal component).

Processing circuitry 18 may multiply the sRGB data by the scaling value to produce corrected sRGB data (e.g., corrected standard red, green, and blue image data). For example, processing circuitry 18 may multiply the standard red image data by the scaling value, the standard green image data by the scaling value, etc. The corrected sRGB data may, if desired be provided to an image display. The corrected sRGB data may have improved noise and/or sharpness when compared with the sRGB data prior to applying the point filter.

The example provided above in connection with step 1608 is merely illustrative. If desired, the point filter operations described in connection with step 1608 may be performed before the color correction matrix is applied. In general, the steps described above in FIG. 17 may be performed in other desired orders to increase noise correlations between image signals and reduce noise amplification by the color correction matrix, although performance may differ between different orders.

In general, the illustrative steps described above in connection with FIG. 17 (in which a blue image signal is extracted from a mixed blue image signal generated by a stacked photodiode pixel 220 and a red image signal is extracted from a mixed red image signal component generated by a stacked photodiode pixel 220) are merely illustrative. If desired, the steps described above in connection with FIG. 17 may be applied to image signals generated by any suitable stacked pixel 220. For example, the steps described above in connection with FIG. 17 may be applied to signals generated by a stacked photodiode pixel 220 that is configured to generate a blue image signal and infrared image signals, but that may inadvertently generate a blue image signal that includes an infrared component and an infrared image signal that includes a blue component (as shown in FIG. 12, for example). The steps described above in connection with FIG. 17 may be applied to signals generated by a stacked photodiode pixel 220 that is configured to generate a green image signal and an infrared signal, but that but that may inadvertently generate a green image signal that includes an infrared component and an infrared image signal that includes a green component (as shown in FIG. 13, for example). If desired, the steps described above in connection with FIG. 17 may be applied more aggressively to mixed image signals (e.g., image signals generated by photodiodes in a stacked pixel 220). In one suitable example, shallow photodiode 204A may produce a mixed image signal having a larger undesirable component than the image signal produced by deep photodiode 204B. The mixed image signal generated by shallow photodiode 204A may have stronger de-noising operations applied to it than an image signal with less undesirable signal components. In general, the steps described above in connection with FIG. 17 may be applied to any image signals (e.g., image signals generated by a shallow photodiode 204A or a deep photodiode 204B in a stacked photodiode pixel 220) that includes an image signal that may be extracted from a mixed image signal generated by the photodiode.

Figure 18:
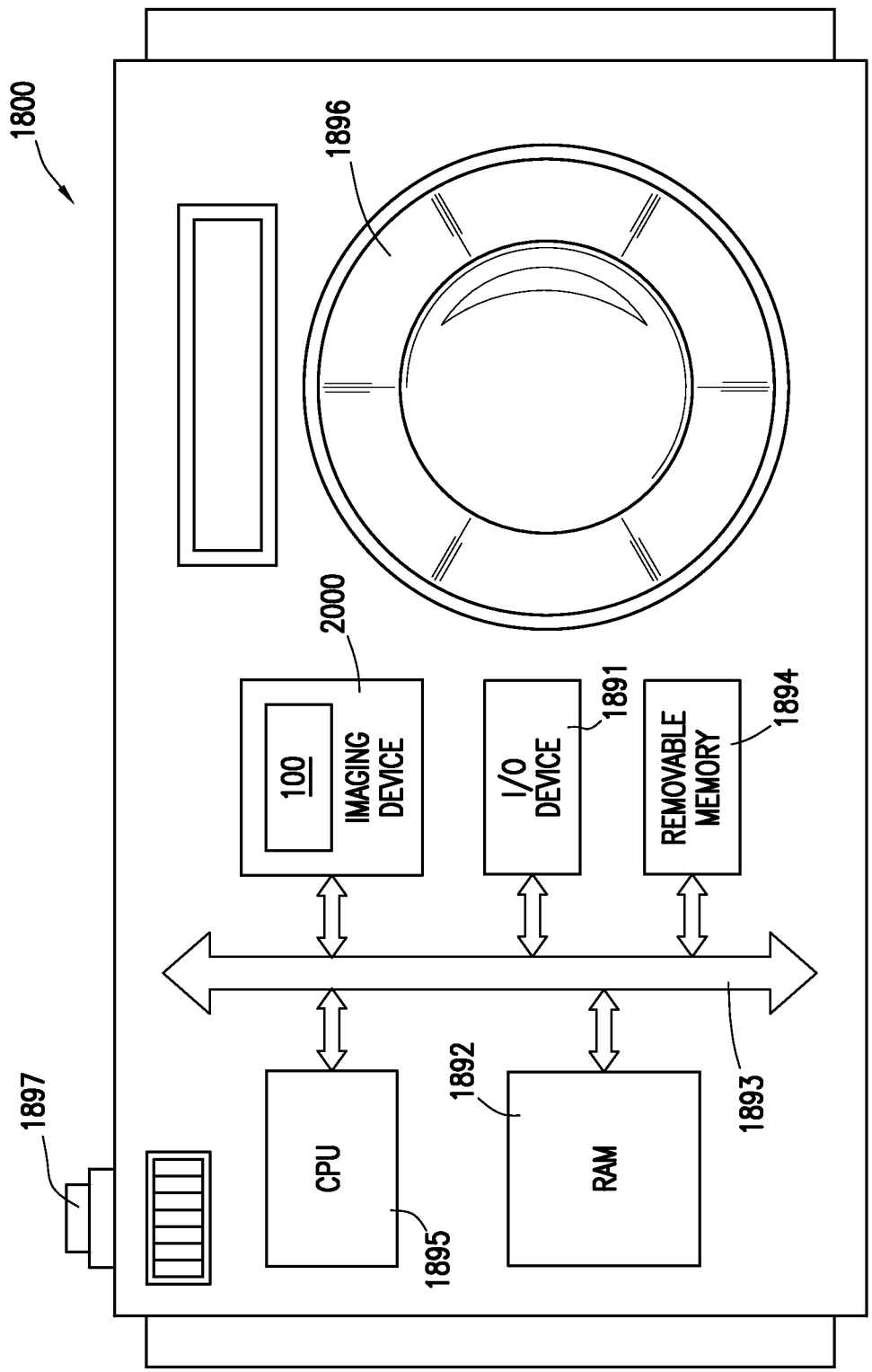
FIG. 18 is a block diagram of a processor system that may employ the embodiments of FIGS. 1-17 in accordance with an embodiment of the present invention.

FIG. 18 shows in simplified form a typical processor system 1800, such as a digital camera, which includes an imaging device 2000 (e.g., an imaging device 2000 such as imaging sensor 16 of FIGS. 1-17 employing image pixels 210 and/or stacked dual photodiode image pixels 220 and the techniques for operations described above). The processor system 1800 is exemplary of a system having digital circuits that could include imaging device 2000. Without being limiting, such a system could include a computer system, still or video camera system, scanner, machine vision, vehicle navigation, video phone, surveillance system, auto focus system, star tracker system, motion detection system, image stabilization system, and other systems employing an imaging device.

The processor system 1800 generally includes a lens 1896 for focusing an image on pixel array 100 of device 2000 when a shutter release button 1897 is pressed, central processing unit (CPU) 1895, such as a microprocessor which controls camera and one or more image flow functions, which communicates with one or more input/output (I/O) devices 1891 over a bus 1893. Imaging device 2000 also communicates with the CPU 1895 over bus 1893. The system 1800 also includes random access memory (RAM) 1892 and can include removable memory 1894, such as flash memory, which also communicates with CPU 1895 over the bus 1893. Imaging device 2000 may be combined with the CPU, with or without memory storage on a single integrated circuit or on a different chip. Although bus 1893 is illustrated as a single bus, it may be one or more busses or bridges or other communication paths used to interconnect the system components.

An imaging system may include an image sensor having an array of pixels that includes a stacked photodiode pixel having a color filter, a first photodiode, and a second photodiode. The first photodiode may be interposed between the color filter and the second photodiode and may generate a first image signal in response to light of a first wavelength band. The second photodiode may generate a second image signal in response to light of a second wavelength band that is different than the first wavelength band. The color filter may block light of a third wavelength band that is different than the first wavelength band and the second wavelength band. The imaging system may include image processing circuitry that receives the first image signal and the second image signal. The image processing circuitry may perform a de-noising operation on at least the first image signal to generate a first de-noised image signal and may perform a color correction operation on at least the first de-noised image signal. The de-noising operation may be configured to reduce noise amplification by the color correction operation.

If desired, the first photodiode may generate the first image signal in response to blue light, the second photodiode may generate the second image signal in response to red light, and the color filter may be a magenta color filter that transmits red light and blue light.

If desired, the first photodiode may generate the first image signal in response to blue light, the second photodiode may generate the second image signal in response to infrared light, and the color filter may be a blue color filter that transmits blue light and infrared light.

If desired, the first photodiode may generate the first image signal in response to green light, the second photodiode may generate the second image signal in response to infrared light, and the color filter may be a green color filter that transmits green light and infrared light.

The first image signal may have a first noise level and the second image signal may have a second noise level. The image processing circuitry may perform the de-noising operation on the first image signal and the second image signal to generate the first de-noised image signal and a second de-noised image signal. The de-noising operation may increase a noise correlation between the first de-noised image signal and the second de-noised image signal to at least 70 percent.

If desired, the image processing circuitry may perform the de-noising operation on at least the first image signal by computing a weighted average for the first image signal based on image signals generated by at least 25 of the pixels in the array.

If desired, the image processing circuitry may generate a point filter based on at least one luma signal. The image processing circuitry may adjust a luma component associated with at least the first image signal using the point filter. The at least one luma signal may include a first luma signal generated by the image sensor prior to processing by the image processing circuitry and a second luma signal generated by the de-noising operation performed by the image processing circuitry. The first luma signal and second luma signal may be used to generate the point filter.

If desired, the image processing circuitry may perform the de-noising operation on the first image signal and the second signal. The de-noising operation may adjust the first image signal by a first amount and may adjust the second signal by a second amount that is less than the first amount.

An imaging device may include an image sensor including an array of pixels having a repeating unit cell that includes at least one dual photodiode pixel having a shallow photodiode that generates a first electrical signal in response to light of a first color, a deep photodiode that generates a second electrical signal in response to light of a second color that is different than the first color, and a color filter formed over the shallow photodiode and the deep photodiode that transmits light of the first color and the second color. The imaging device may include processing circuitry that processes the first electrical signal such that a noise correlation between the first electrical signal and the second electrical signal is increased. The processing circuitry may apply a color correction to the first electrical signal having the increased noise correlation to remove a component of the first electrical signal generated in response to the light of the second color.

If desired, the dual photodiode pixel may be a magenta pixel in which the shallow photodiode generates the first electrical signal in response to blue light, the deep photodiode generates the second electrical signal in response to red light, and the color filter is a magenta color filter that transmits red light and blue light and that blocks green light.

If desired, the unit cell may include an additional pixel and first and second diagonally opposed green pixels that each generate green image signals in response to green light. The additional pixel may be an infrared pixel that generates an infrared image signal in response to infrared light. The additional pixel may be an additional magenta pixel that generates a first electrical signal in response to blue light and a second electrical signal in response to red light.

If desired, the unit cell may include an additional pixel and first and second diagonally opposed clear pixels that each generate broadband image signals in response to at least two different colors of light. The additional pixel may be an infrared pixel that generates an infrared image signal in response to infrared light. The additional pixel may be an additional magenta pixel that generates a first electrical signal in response to blue light and a second electrical signal in response to red light. The additional pixel may be a green pixel that generates a green image signal in response to green light.

An image sensor may include an array of pixels formed in rows and columns that includes a pixel block having four adjacent pixels. The pixel block may include at least one stacked photodiode pixel that includes a first photodiode that generates a color image signal in response to a given color of light, a second photodiode that generates an infrared image signal in response to infrared light, and a color filter element that passes the given color of light and the infrared light. The first photodiode may be formed between the color filter element and the second photodiode.

If desired, the at least one stacked photodiode pixel may include a first stacked photodiode pixel diagonally opposite from a second stacked photodiode pixel. In each of the first and second stacked photodiode pixels, the color filter may be a green color filter and the first color image signal generated by the first photodiode in response to the given color of light may be a green image signal generated in response to green light. The pixel block may include third and fourth stacked photodiode pixels that each include a first photodiode that generates a blue image signal in response to blue light, a second photodiode that generates a red image signal in response to red light, and a color filter element that allows the blue light and the red light to pass. The first photodiode may be formed between the color filter element and the second photodiode.

In the at least one stacked photodiode pixel, the color filter may be a green color filter and the color image signal generated by the first photodiode in response to the given color of light may be a green image signal generated in response to green light. The pixel block may include a second stacked photodiode pixel having a first photodiode that generates a blue image signal in response to blue light, a second photodiode that generates a red image signal in response to red light, and a color filter element that allows the blue light and the red light to pass. The first photodiode may be formed between the color filter element and the second photodiode. The pixel block may include a pair of diagonally opposed broadband pixels that each have a color filter that transmits at least two different colors of light.

In the at least one stacked photodiode pixel, the color filter may be a blue color filter and the first color image signal generated by the first photodiode in response to the given color of light may a blue image signal generated in response to blue light. The pixel block may include a first clear pixel that generates a broadband image signal in response to at least two different colors of light that is diagonally opposed from a second clear pixel that generates a broadband image signal in response to at least two different colors of light.

If desired, the first photodiode may be formed on a first silicon substrate and the second photodiode may be at least partially formed on a second silicon substrate that is bonded to the first silicon substrate.

The foregoing is merely illustrative of the principles of this invention which can be practiced in other embodiments.

What is claimed is:

1. An imaging system comprising:
   an image sensor having an array of pixels, wherein the array of pixels includes a stacked photodiode pixel having a color filter, a first photodiode, and a second photodiode, wherein the first photodiode is interposed between the color filter and the second photodiode, wherein the first photodiode generates a first image signal in response to light of a first wavelength band, wherein the second photodiode generates a second image signal in response to light of a second wavelength band that is different than the first wavelength band, and wherein the color filter blocks light of a third wavelength band that is different than the first wavelength band and the second wavelength band; and
   image processing circuitry that receives the first image signal and the second image signal, wherein the image processing circuitry performs a de-noising operation on the first image signal and the second image signal, wherein the de-noising operation adjusts the first image signal by a first amount to generate a first de-noised image signal, and wherein the de-noising operation adjusts the second signal by a second amount that is less than the first amount, wherein the image processing circuitry performs a color correction operation on at least the first de-noised image signal, and wherein the de-noising operation is configured to reduce noise amplification by the color correction operation.

2. The imaging system defined in claim 1, wherein the first photodiode generates the first image signal in response to blue light, wherein the second photodiode generates the second image signal in response to red light, and wherein the color filter is a magenta color filter that transmits the red light and the blue light.

3. The imaging system defined in claim 1, wherein the first photodiode generates the first image signal in response to blue light, wherein the second photodiode generates the second image signal in response to infrared light, and wherein the color filter is a blue color filter that transmits the blue light and the infrared light.

4. The imaging system defined in claim 1, wherein the first photodiode generates the first image signal in response to green light, wherein the second photodiode generates the second image signal in response to infrared light, and wherein the color filter is a green color filter that transmits the green light and the infrared light.

5. The imaging system defined in claim 1, wherein the first image signal has a first noise level and the second image signal has a second noise level, wherein the image processing circuitry performs the de-noising operation on the first image signal and the second image signal to generate the first de-noised image signal and a second de-noised image signal, and wherein the de-noising operation increases a noise correlation between the first de-noised image signal and the second de-noised image signal to at least 70 percent.

6. The imaging system defined in claim 1, wherein the image processing circuitry performs the de-noising operation on at least the first image signal by computing a weighted average for the first image signal based on image signals generated by at least 25 of the pixels in the array.

7. The imaging system defined in claim 1, wherein the image processing circuitry generates a point filter based on at least one luma signal, and wherein the image processing circuitry adjusts a luma component associated with at least the first image signal using the point filter.

8. The imaging system defined in claim 7, wherein the at least one luma signal comprises a first luma signal generated by the image sensor prior to processing by the image processing circuitry and a second luma signal generated by the de-noising operation performed by the image processing circuitry, and wherein the first luma signal and second luma signal are used to generate the point filter.

9. The imaging system defined in claim 1, wherein the color filter is part of an array of color filters of different colors that overlaps the array of pixels, and wherein at least one of the color filters in the array passes light of the first wavelength band and blocks light of the second wavelength band.

10. An imaging device comprising:
    an image sensor including an array of pixels having a repeating unit cell, wherein the unit cell comprises at least one dual photodiode pixel having a shallow photodiode that generates a first electrical signal in response to light of a first color, a deep photodiode that generates a second electrical signal in response to light of a second color that is different than the first color, and a color filter formed over the shallow photodiode and the deep photodiode that transmits light of the first color and the second color; and
    processing circuitry that processes the first electrical signal such that a noise correlation between the first electrical signal and the second electrical signal is increased, wherein the processing circuitry applies a color correction to the first electrical signal having the increased noise correlation to remove a component of the first electrical signal generated in response to the light of the second color.

11. The imaging device defined in claim 10, wherein the dual photodiode pixel is a magenta pixel in which the shallow photodiode generates the first electrical signal in response to blue light, wherein the deep photodiode generates the second electrical signal in response to red light, and wherein the color filter is a magenta color filter that transmits red light and blue light and that blocks green light, the unit cell further comprising:
    first and second diagonally opposed green pixels that each generate green image signals in response to green light; and
    an additional pixel.

12. The imaging device defined in claim 11, wherein the additional pixel comprises an infrared pixel that generates an infrared image signal in response to infrared light.

13. The imaging device defined in claim 11, wherein the additional pixel comprises an additional magenta pixel that generates a first electrical signal in response to blue light and a second electrical signal in response to red light.

14. The imaging device defined in claim 10, wherein the dual photodiode pixel is a magenta pixel in which the shallow photodiode generates the first electrical signal in response to blue light, wherein the deep photodiode generates the second electrical signal in response to red light, and wherein the color filter is a magenta color filter that transmits red light and blue light and that blocks green light, the unit cell further comprising:

first and second diagonally opposed clear pixels that each generate broadband image signals in response to at least two different colors of light; and an additional pixel.

15. The imaging device defined in claim 14, wherein the additional pixel comprises an infrared pixel that generates an infrared image signal in response to infrared light.

16. The imaging device defined in claim 14, wherein the additional pixel comprises an additional magenta pixel that generates a first electrical signal in response to blue light and a second electrical signal in response to red light.

17. The imaging device defined in claim 14, wherein the additional pixel comprises a green pixel that generates a green image signal in response to green light.

18. The imaging device defined in claim 10, wherein the color filter is part of an array of color filters of different colors that overlaps the array of pixels, and wherein at least one of the color filters in the array transmits light of the first color and blocks light of the second color.

19. An imaging system comprising:
   an image sensor having an array of pixels formed in rows and columns, wherein the array of pixels includes a pixel block comprising four adjacent pixels, wherein the four adjacent pixels in the pixel block include at least one stacked photodiode pixel comprising a first photodiode that generates a color image signal in response to a given color of light, a second photodiode that generates an infrared image signal in response to infrared light, and a color filter element that passes the given color of light and the infrared light, and wherein the first photodiode is formed between the color filter element and the second photodiode; and
   processing circuitry that computes a luma signal using at least the infrared image signal, wherein the processing circuitry performs a color correction operation on at least the color image signal to generate a corrected color image signal, and wherein the processing circuitry is configured to apply the luma signal to the color image signal to reduce noise introduced by generating the corrected color image signal with the color correction operation.

20. The imaging system defined in claim 19, wherein the at least one stacked photodiode pixel comprises a first stacked photodiode pixel diagonally opposite from a second stacked photodiode pixel, wherein in each of the first and second stacked photodiode pixels the color filter is a green color filter and the first color image signal generated by the first photodiode in response to the given color of light is a green image signal generated in response to green light.

21. The imaging system defined in claim 20, wherein the pixel block includes third and fourth stacked photodiode pixels, wherein each of the third and fourth stacked photodiode pixels comprises:
   a first photodiode that generates a blue image signal in response to blue light, a second photodiode that generates a red image signal in response to red light, and a color filter element that allows the blue light and the red light to pass, wherein the first photodiode is formed between the color filter element and the second photodiode.

22. The imaging system defined in claim 19, wherein in the at least one stacked photodiode pixel the color filter is a green color filter and the color image signal generated by the first photodiode in response to the given color of light is a green image signal generated in response to green light, and wherein the pixel block further comprises:
   a second stacked photodiode pixel comprising a first photodiode that generates a blue image signal in response to blue light, a second photodiode that generates a red image signal in response to red light, and a color filter element that allows the blue light and the red light to pass, wherein the first photodiode is formed between the color filter element and the second photodiode; and
   a pair of diagonally opposed broadband pixels that each have a color filter that transmits at least two different colors of light.

23. The imaging system defined in claim 19, wherein in the at least one stacked photodiode pixel the color filter is a blue color filter and the first color image signal generated by the first photodiode in response to the given color of light is a blue image signal generated in response to blue light, and wherein the pixel block further comprises:
   a first clear pixel that generates a broadband image signal in response to at least two different colors of light, wherein the first clear image pixel is diagonally opposed from a second clear pixel that generates a broadband image signal in response to at least two different colors of light.

24. The imaging system defined in claim 19, wherein the first photodiode is formed on a first silicon substrate, and wherein the second photodiode is at least partially formed on a second silicon substrate that is bonded to the first silicon substrate.

* * * * *